United States Patent [19]

Herold et al.

[11] Patent Number: 4,901,036

[45] Date of Patent: Feb. 13, 1990

[54] FREQUENCY SYNTHESIZER WITH AN INTERFACE CONTROLLER AND BUFFER MEMORY

[75] Inventors: Barry W. Herold, Boca Raton; Omid Tahernia, Coconut Creek; Walter L. Davis, Coral Springs; Mario A. Rivas, West Palm Beach, all of Fla.

[73] Assignee: Motorola, Inc., Schaumburg, Ill.

[21] Appl. No.: 372,997

[22] Filed: Jun. 29, 1989

[51] Int. Cl.$^4$ ............................................. H03L 7/00
[52] U.S. Cl. .................................. 331/25; 358/191.1; 455/183
[58] Field of Search .......................... 331/1 A, 23, 25; 358/191.1; 455/165, 183, 260; 307/529

[56] References Cited

U.S. PATENT DOCUMENTS

| | | | |
|---|---|---|---|
| 4,326,220 | 4/1982 | Mogi ................................ | 358/191.1 |
| 4,451,850 | 5/1984 | Kamemoto ....................... | 358/191.1 |
| 4,476,580 | 10/1984 | Tanaka et al. ................... | 455/165 X |
| 4,516,170 | 5/1985 | Skerlos ............................ | 358/191.1 |

OTHER PUBLICATIONS

Plessey Co. PFC, Specification for NJ88C31, Publication No. P.S. 2059, May 1986.

*Primary Examiner*—Eugene R. Laroche
*Assistant Examiner*—Robert J. Pascal
*Attorney, Agent, or Firm*—William E. Zitelli; Vincent B. Ingrassia

[57] ABSTRACT

A frequency synthesizer which has at least one programmably characterized phase lock loop circuit includes a buffer memory and an interface controller responsive to operational codes received from a central controller to direct transfer of data words for characterization of the phase lock loop circuit among the at least one phase lock loop circuit, the buffer memory, and the central controller. In one embodiment, the transfer of data words between the central controller and phase lock loop circuit or buffer memory are performed serially in accordance with a prespecified protocol and governed by a clock signal generated by the central controller. Data word transfers between the buffer memory and at least one phase lock loop circuit may also be performed serially in accordance with a prespecified protocol, but may be governed autonomously by an internal clock signal generated by the frequency synthesizer.

26 Claims, 14 Drawing Sheets

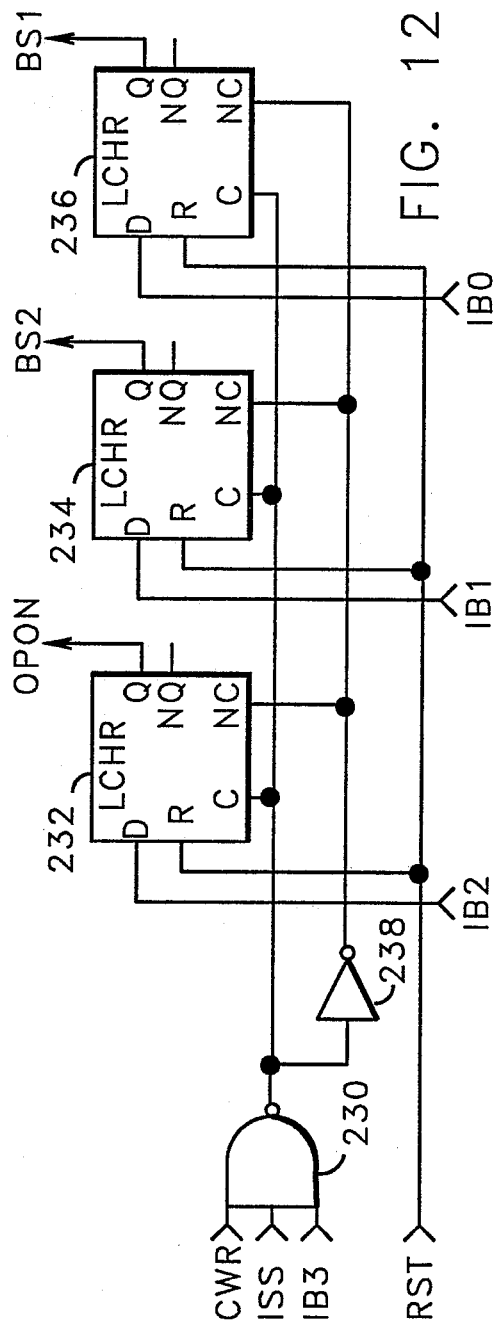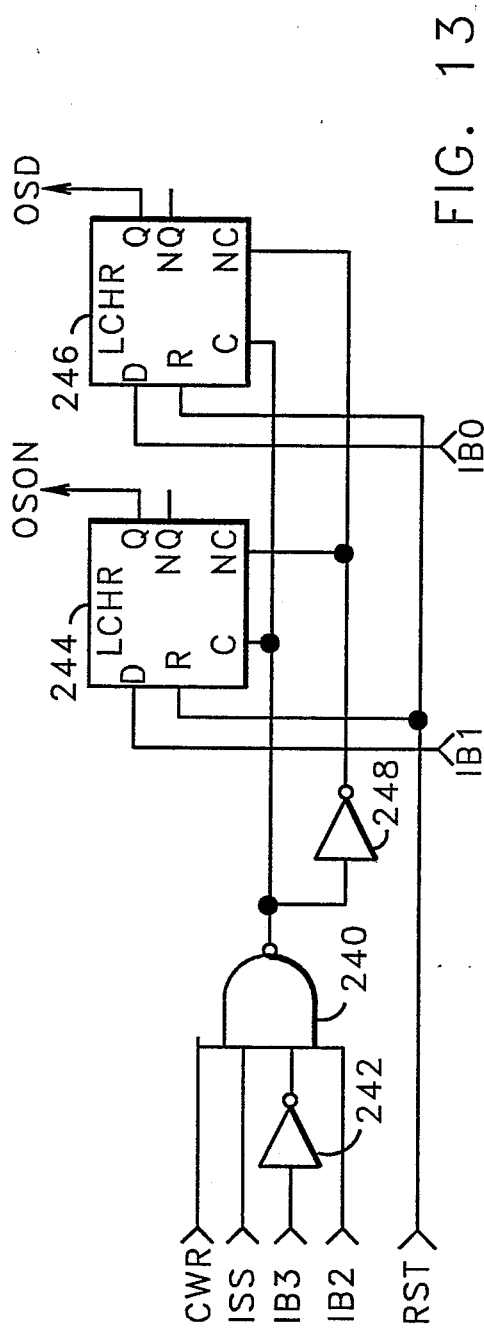

| FUNCTION | MNEMONIC | OPCODE | DATA |
|---|---|---|---|
| SPIO ENABLE | IOE | 0000 | |
| L01 LOAD FROM SPI | L1S | 0001 | L01 LOOP DATA |
| L01 LOAD FROM MEM | L1M | 0010 | L01 MEM ADDRESS' |
| L01 TEST | L1T | 0011 | 0000/TEST DATA |
| L02 LOAD FROM SPI | L2S | 0100 | L02 LOOP DATA |
| L02 TEST | L2T | 0101 | 000/TEST DATA |
| MEMORY WRITE L01 | MW1 | 0110 | 0000/L01 MEM ADDRESS/L01 LOOP DATA |
| MEMORY READ L01 | MR1 | 0111 | L01 MEM ADDRESS |
| MEMORY WRITE L02 0 | MW20 | 1000 | L02 LOOP DATA |
| MEMORY WRITE L02 1 | MW21 | 1001 | L02 LOOP DATA |
| MEMORY READ L02 0 | MR20 | 1010 | 0000 |
| MEMORY READ L02 1 | MR21 | 1011 | 0000 |
| LOAD L01 L02 0 | CS0 | 1100 | L01 MEM ADDRESS |
| LOAD L01 L02 1 | CS1 | 1101 | L01 MEM ADDRESS |
| CONTROL WRITE | CWR | 1110 | CONTROL WORD |
| PORT WRITE | PWR | 1111 | PORT DATA |

FIG. 16

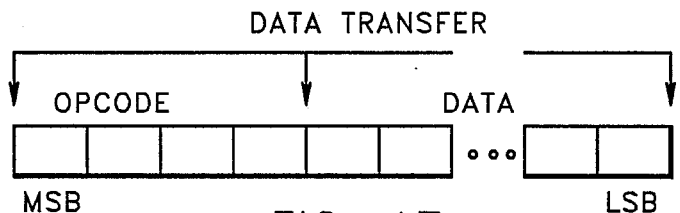
FIG. 17
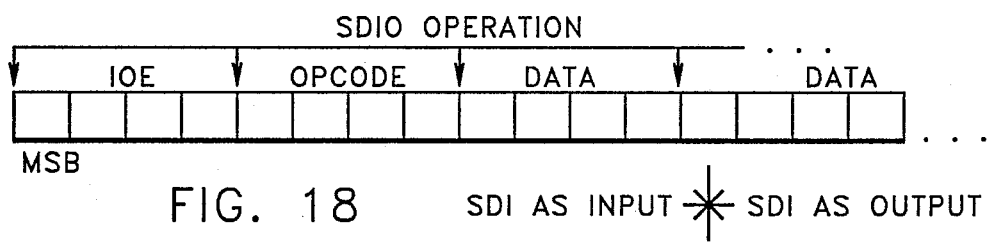
FIG. 18    SDI AS INPUT ✳ SDI AS OUTPUT
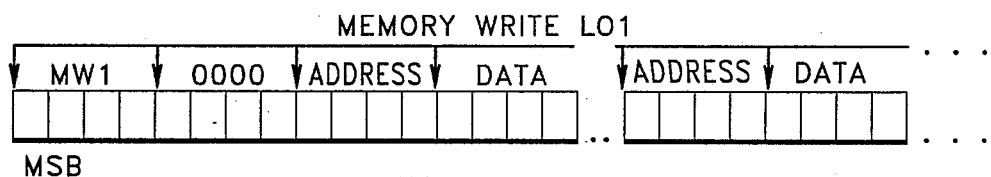
FIG. 19
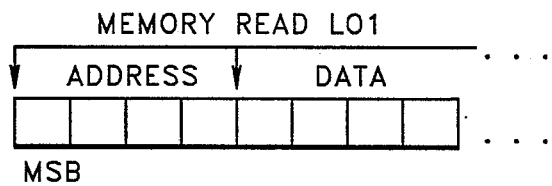
FIG. 20
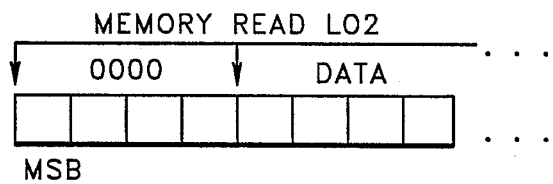
FIG. 21

OUTPUT DEFINITION

| MNEMONIC | SO | IBI | LE | DI | DI2 |
|---|---|---|---|---|---|
| IOE | IB3 | SI | 1 | X | X |
| L1S | SQ1 | X | 1 | SI | X |
| L1M | MDO | SI | 0 | MDO | X |
| L1T | SQ1 | X | 0 | SI | X |
| L2S | SQ2 | X | 1 | X | SI |
| L2T | SQ2 | X | 0 | X | SI |
| MW1 | MDO | MDO | 1 | SI | X |
| MR1 | IB3 | MDO | 1 | X | X |
| MW20 | NIBCK | X | 0 | SI | X |
| MW21 | S2 | X | 0 | SI | X |
| MR20 | IB3 | MDO | 1 | X | X |
| MR21 | IB3 | MDO | 1 | X | X |
| CS0 | MDO | SI | 0 | MDO | SQ1 |
| CS1 | MDO | SI | 0 | MDO | SQ1 |
| CWR | IB3 | SI | 1 | X | X |
| PWR | IB3 | SI | 1 | X | X |

FIG. 22

FREQUENCY SYNTHESIZER WITH AN INTERFACE CONTROLLER AND BUFFER MEMORY

BACKGROUND OF THE INVENTION

The present invention relates generally to frequency synthesizers having at least one programmably characterized phase lock loop (PLL) circuit, and more particularly, to a frequency synthesizer including a buffer memory and an interface controller responsive to operational codes received from a central controller to direct transfer of data words for characterization of a PLL circuit among the at least one PLL circuit, the buffer memory, and the central controller.

Contemporary frequency synthesizers, like the type manufactured by Plessey Semiconductors, model number NJ88C31, for example, include a PLL circuit and at least one register which is dynamically programmable with data words for uniquely characterizing the PLL circuit in its generation of a synthesized channel frequency signal. The at least one register may include a shift register governed by an external clock signal for serially receiving a data word from a single data line, and at least one latching register for transferring, in response to an external data transfer signal, the data word in parallel from the shift register to the PLL circuit for operational characterization thereof.

Conventionally, frequency synthesizers of the aforementioned type may be, at times, controlled by a central controller, which may be a microcomputer, for example, generally utilizing a serial peripheral interface thereof. In such systems, the serial peripheral interface of the microcomputer would be dedicated to the frequency synthesizer for serially transferring a data word thereto to uniquely characterize the frequency synthesizer in its generation of a synthesized channel frequency signal. Accordingly, the central controller is burdened with accomplishing each serial data stream transfer which could be quite time consuming, especially in radio receiver operations, like channel searching, for example.

In some cases, the frequency synthesizers may include a plurality of PLL circuits, each having its own programmable characterization circuitry and each requiring a serial peripheral interface from the central controller. Most central controllers do not have a plurality of serial peripheral interfaces and/or cannot afford to dedicate such for the sole use of characterizing the PLL circuits of a frequency synthesizer, although some central controllers do permit timesharing of a peripheral interface among a plurality of peripheral devices. For an example of a frequency synthesizer having a plurality of PLL circuits, reference may be made to the copending patent application bearing Ser. No. 345,809; filed May 1, 1989 by Herold et al. entitled "A Frequency Synthesizer with Dynamically Programmable Frequency Range of Selected Loop Bandwidth"; and assigned to the same assignee as the instant application.

The present invention offers an interface controller for a frequency synthesizer having at least one PLL circuit programmably characterized to generate a channel frequency signal, which interface controller is intended to alleviate the above described limitations of programmably characterizing such PLL circuits.

SUMMARY OF THE INVENTION

In accordance with the present invention, a frequency synthesizer which includes at least one phase lock loop (PLL) circuit operationally characterized by a central controller to generate a synthesized channel frequency comprises an interface controller and a buffer memory. The PLL circuit includes at least one storage register dynamically programmable with data words which characterize the operation of the PLL circuit in generating the synthesized channel frequency signal. The interface controller is coupled between the central controller and the at least one storage register and operative to receive operational code words and data words from the central controller. The buffer memory is coupled to the interface controller for storing a plurality of data words for characterizing the operation of the PLL circuit. The interface controller is responsive to the operational code words received from the central controller to direct a transfer of data words between the central controller, the at least one storage register and the buffer memory.

In one embodiment, the interface controller includes first means selectively operative to couple the central controller to the at least one storage register and to control the transfer of a data word therebetween; second means selectively operative to couple the central controller to the buffer memory and to control the transfer of a data word therebetween; third means selectively operative to couple the buffer memory to the at least one storage register and to control the transfer of a data word therebetween; and means for decoding an operational code word received from the central controller and for selecting one of the first, second, and third means to perform its specified operation based on the decoded operational code word.

In another embodiment, the interface controller is operative to receive operational code words, corresponding data words, and characterization data words from the central controller. The buffer memory stores a plurality of characterization data words in a corresponding plurality of registers, each such data word corresponding to a unique characterization of operation of the PLL circuit in generating the synthesized channel frequency signal. In this embodiment, the interface controller is responsive to a first operational code word and corresponding first data word to transfer a characterization data word from the central controller to the buffer memory for storage in a register uniquely corresponding to the code of the first data word. The interface controller is also responsive to a second operational code word and corresponding second data word to transfer a characterization data word from a register of the buffer memory corresponding uniquely to the code of the second data word to the at least one storage register of the PLL circuit. The transfer of a characterization data word between the central controller and the buffer memory may be governed by a clock signal generated by the central controller and the transfer of a characterization word from the buffer memory to the at least one storage register of the PLL circuit may be governed by an internal clock signal generated by the frequency synthesizer.

In another embodiment, the frequency synthesizer may include a plurality of PLL circuits each including a storage register dynamically programmable with data words which characterize the operation of its corresponding PLL circuit. In this embodiment, the interface controller is responsive to an operational code word and corresponding data word to direct a transfer of a characterization data word from a selected register of the buffer memory to the storage register of a selected one of the plurality of PLL circuits. Such a transfer may be directed by the interface controller autonomously in response to an operational code word and corresponding data word received from the central controller.

In a further embodiment, the interface controller may include means responsive to a single operational code word and single corresponding data word to direct a transfer of a plurality of characterization data words from selected corresponding registers of the buffer memory to the storage registers of a selected corresponding plurality of PLL circuits.

BRIEF DESCRIPTION OF THE DRAWINGS

FIGS. 12, 13, and 14 are circuit schematics of three control registers suitable for use in the interface controller embodiment of FIG. 2.

FIG. 16 is a table of operational codes for use in describing the various operations performed by the interface controller embodiment depicted in FIG. 2.

FIGS. 17-21 illustratively depict protocols for transferring serially information between the central controller, the interface controller and buffer memory of the present invention.

FIG. 22 is a table which depicts various operational codes and associated interconnections of the interface controller of FIG. 2 in response to such operational codes.

DESCRIPTION OF THE PREFERRED EMBODIMENT

Figure 1:
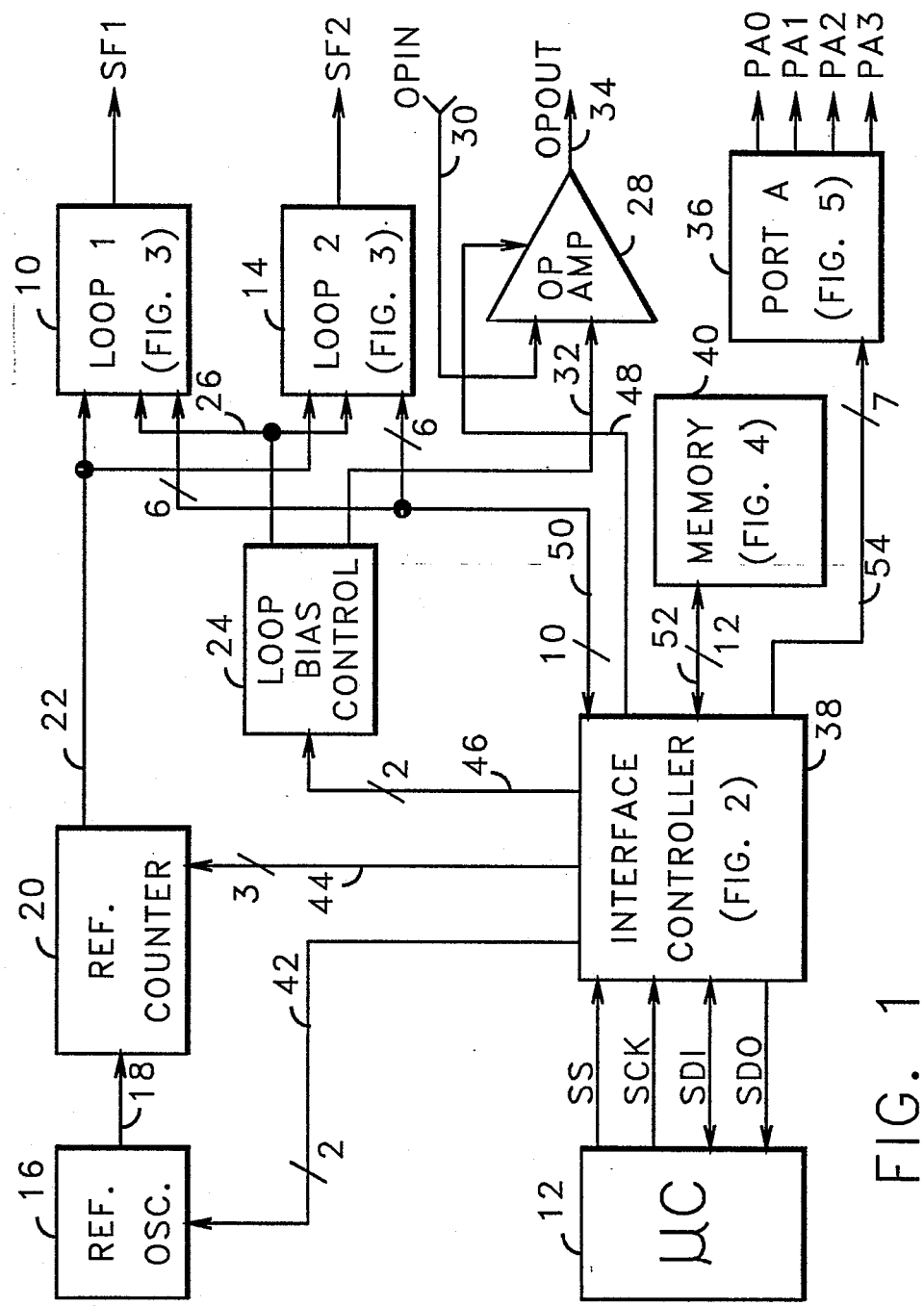
FIG. 1 is a block diagram schematic of a frequency synthesizer suitable for embodying the principles of the present invention.
Figure 3:
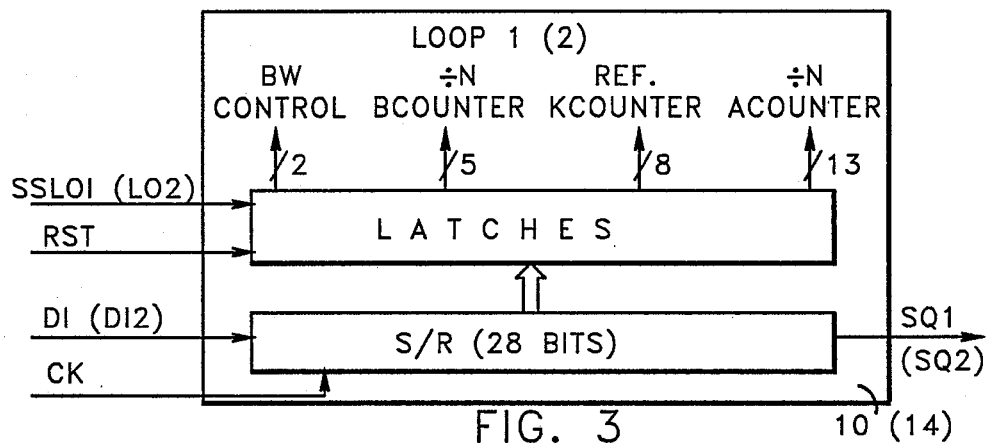
FIG. 3 is a block diagram illustration of the storage registers of a phase lock loop suitable for use in the embodiment of FIG. 1.

In FIG. 1 is shown a block diagram schematic of a frequency synthesizer suitable for use in a radio receiver, for example, and suitable for embodying the principles of the present invention. The frequency synthesizer includes at least one phase lock loop (PLL) circuit 10 which is operationally characterized by a central controller 12 which may include a microcomputer similar to the type manufactured by Motorola, Inc., Model No. M6805C4, which includes a three-port hardware serial peripheral interface. The instant frequency synthesizer embodiment includes a plurality of PLL circuits including a PLL circuit 14 which is also operationally characterized by the central controller 12. Each PLL circuit 10 and 14 includes at least one storage register (see FIG. 3) which is dynamically programmable with data words that characterize the operation of the respective PLL circuit for generating a corresponding synthesized channel frequency signal SF1 and SF2. PLL circuits suitable for use in the frequency synthesizer embodiment of FIG. 1 are described in the aforementioned co-pending patent application bearing Ser. No. 345,809; filed May 1, 1989 which is hereby incorporated by reference herein for providing the details of operation of such a PLL circuit.

The frequency synthesizer embodiment of FIG. 1 further includes a conventional reference oscillator circuit 16 which is operationally characterized by the central controller 12 to generate a very stable oscillator signal over signal line 18 coupled to a conventional reference counter circuit 20 which is also operationally characterized by the central controller 12 to divide down the oscillation signal 18 and provide a stable reference oscillator signal over signal line 22 to the various PLL circuits 10 and 14 for use therein.

The frequency synthesizer also includes a loop bias control circuit 24 which is also operationally characterized by the central controller 12 to generate an analog bias signal over signal line 26 which is provided to the PLL circuit 10 and 14 for adjusting the frequency range of their corresponding loop bandwidths.

Peripheral to the frequency synthesizer is an operational amplifier circuit 28 which may be turned "on" and "off" by the central controller 12 to amplify an analog input received over signal line 30 which taken together with a bias reference signal generated by the bias control circuit 24 over signal line 32 produces an analog output signal (OPOUT) over signal line 34. Also peripheral to the frequency synthesizer is a digital output port circuit 36 which is programmably operative to generate digital outputs denoted as PA0-PA3.

In accordance with one aspect of the present invention, the frequency synthesizer includes an interface controller 38 which is coupled between the central controller 12 and the various foregoing described circuits 10, 14, 16, 20, 24, 28, and 36 of the frequency synthesizer. The interface controller 38 is operative to receive operational code words from the central controller 12 utilizing signal interface lines denoted as SS, SCK, and SDI. Data words corresponding to the operational control words may also be transferred between the central controller 12 and interface controller 38 utilizing the aforementioned set of signals and in addition a signal line SDO. Still further, the frequency synthesizer may also include a buffer memory 40 coupled to the interface controller 38 for storing a plurality of data words for characterizing the operation of the plurality of PLL circuits. In operation, the interface controller 38 is responsive to operational code words received from the central controller 12 to direct a transfer of data words between the central controller and a selected one or more of the various foregoing described circuits 10, 14, 16, 20, 24, 36, and 40, and between the buffer memory 40 and a selected one or more of the plurality of PLL circuits 10 and 14.

In the present embodiment, the interface controller 38 includes a plurality of control registers (see FIG. 2) for storing the data words which characterize the circuits 16, 20, 24, and 28. More specifically, two binary bits are coupled from one control register CREG 2 of the controller 38 over signal lines 42 to the reference oscillator 16 to govern the oscillation frequency of the signal generated thereby. In addition, two binary bits are provided from another register CREG 3 of the controller 38 over signal lines 44 to the reference counter 20 to characterize the divisional number used to divide down the frequency of the oscillation signal received from the reference oscillator in order to generate the stable reference frequency signal over signal line 22. Still further, two binary bits are provided from still another register CREG 1 of the controller 38 over signal lines 46 to the loop bias control circuit 24 to characterize the magnitude of the analog signal generated thereby over signal line 26. Finally, one binary bit is provided from CREG 1 over signal line 48 to the operational amplifier 28 to provide control thereof in the generation of the analog output signal over signal line 34.

In the present embodiment, the interface controller 38 is also coupled to the PLL circuits 10 and 14 over signal lines 50 which include six signal lines for each of the loop circuits 10 and 14, two of which being common signal lines; coupled to the buffer memory 40 over signal lines 52 which include 12 signal lines; and coupled to the circuit 36 over signal lines 54 which include seven signal lines. This signal transfer coupling between the central controller 12 and various circuits of the frequency synthesizer utilizing the interface controller 38 and buffer memory 40 will be described in greater detail in connection with FIG. 2 hereinbelow.

Figure 2:
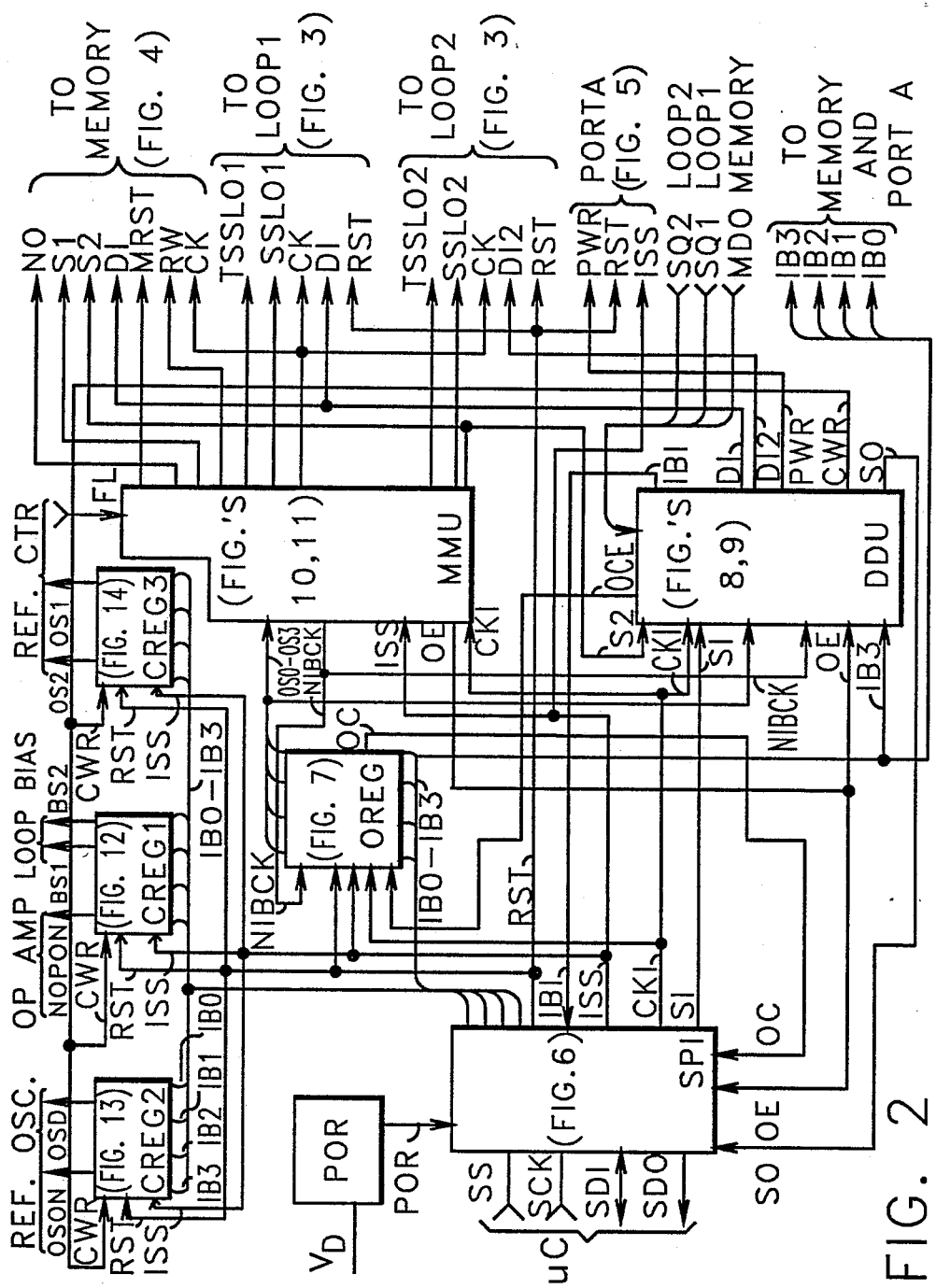
FIG. 2 is a block diagram schematic of an interface controller suitable for use in the frequency synthesizer embodiment depicted in FIG. 1.

Referring to FIG. 2, in the present embodiment, the central controller 12 is coupled to the interface controller 38 through three or four signal lines denoted as SS, SCK, SDI, and SDO. These signals are coupled into a circuit of the interface controller 38 denoted by the block SPI in FIG. 2. A logic schematic diagram of a suitable embodiment for the SPI circuit is shown in FIG. 6.

Figure 6:
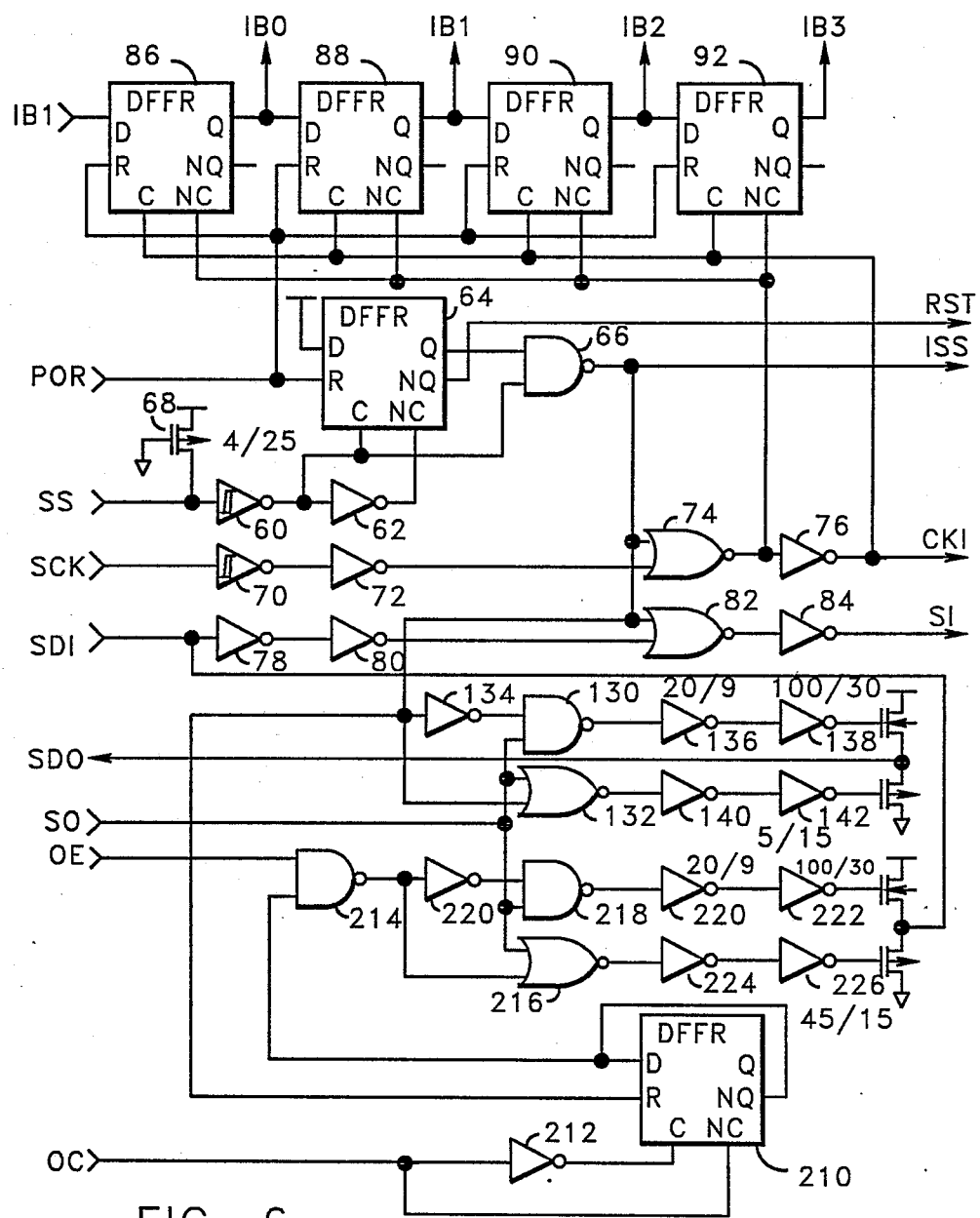
FIG. 6 is a circuit schematic of a serial peripheral interface circuit suitable for use in the interface controller embodiment depicted in FIG. 2.

Referring to FIG. 6, a chip select signal SS is generated (active low) by the central computer 12 and is coupled to an input of a Schmitt-trigger inverter gate 60, the output of which being coupled to the input of another inverter gate 62, the clock C input of a D-type flip-flop 64, and to one input of a NAND gate 66. The signal line SS may be pulled up to a supply voltage through a PMOS transistor 68 biased to ground potential. The output of the inverter gate 62 may be coupled to the clock NC input of the flip-flop 64. The D input of the flip-flop 64 is permanently coupled to the voltage supply or a signal equivalent to a logical one, and the reset input thereof is coupled to a power on reset (POR) signal. The POR signal is developed from a power on reset circuit coupled to the SPI circuit as shown in FIG. 2. More details of the power on reset circuit will be described herebelow in connection with the circuit diagram schematic of FIG. 15. The Q output of the flip-flop 64 is coupled to another input of the NAND gate 66 and the output thereof effects the signal ISS which is referred to as the internal slave select signal and is provided to various circuits of the interface controller 38 as an enabling signal (see FIG. 2). The NQ output of the flip-flop 64 is distributed to the various circuits of the interface controller and various other circuits of the frequency synthesizer as a reset signal denoted as RST (see FIG. 2).

In operation, when the power on reset signal POR is driven low as an indication of adequate power supply, the flip-flop 64 is enabled to respond to its C and NC inputs. Each time the central controller 12 desires to initiate a data word transfer, it selects the interface controller 38 by rendering the signal SS to a logical zero (active state) which provides a positive going edge at the output of the inverter 60 and C input of the flip-flop 64. Concurrently therewith, a negative going signal edge is effected at the output of the inverter 62 and at the NC input of the flip-flop 64. This clocking action effects a logical one and logical zero at the output's Q and NQ, respectively, of the flip-flop 64 which in turn cause the signals ISS and RST to both go low which are their active states.

At times, during a data word transfer, the central controller 12 provides a clock signal SCK which is conducted through another Schmitt-trigger inverter gate 70, another inverter gate 72 to one input of a NOR gate 74. The output of the NOR gate 74 is coupled through an inverter gate 76 to effect an internal clock signal, denoted as CKI which is distributed to various circuits within the interface controller 38 (see FIG. 2). Synchronized to the clock signal SCK, the digital bits of the data word transferred from the central controller 12 are serially conducted over the signal line denoted SDI through two cascadedly coupled inverter gates 78 and 80 to the input of another NOR gate 82. The output of the NOR gate 82 is coupled through another inverter gate 84 to an internal serial bus line, denoted as SI, over which the serialized data word is distributed to various circuits of the controller 38 (see FIG. 2). Still further, an internal bus interface line, denoted as IBI, is coupled to the D input of a D-type flip-flop 86 of the SPI circuit from another circuit of the controller 38. Other D-type flip-flops 88, 90, and 92 are coupled together with the flip-flop 86 to form a conventional serial shift register arrangement to convert a serialized four-bit word, commonly referred to as a nibble, received over the IBI line, to a parallel four-bit word which is output correspondingly from the Q outputs of the flip-flops 86, 88, 90, and 92 over respective signal lines denoted as IB0-IB3. Reset inputs of the flip-flops 86-92 are coupled commonly to the POR signal and the C and NC clocking inputs thereof are coupled to the outputs of the NOR gate 76 (CKI) and inverter gate 74 ($\overline{CKI}$), respectively. The remaining portion of the embodiment of FIG. 6 will be described hereinbelow in connection with additional circuits denoted as MMU and DDU of the interface controller embodiment of FIG. 2.

Figure 7:
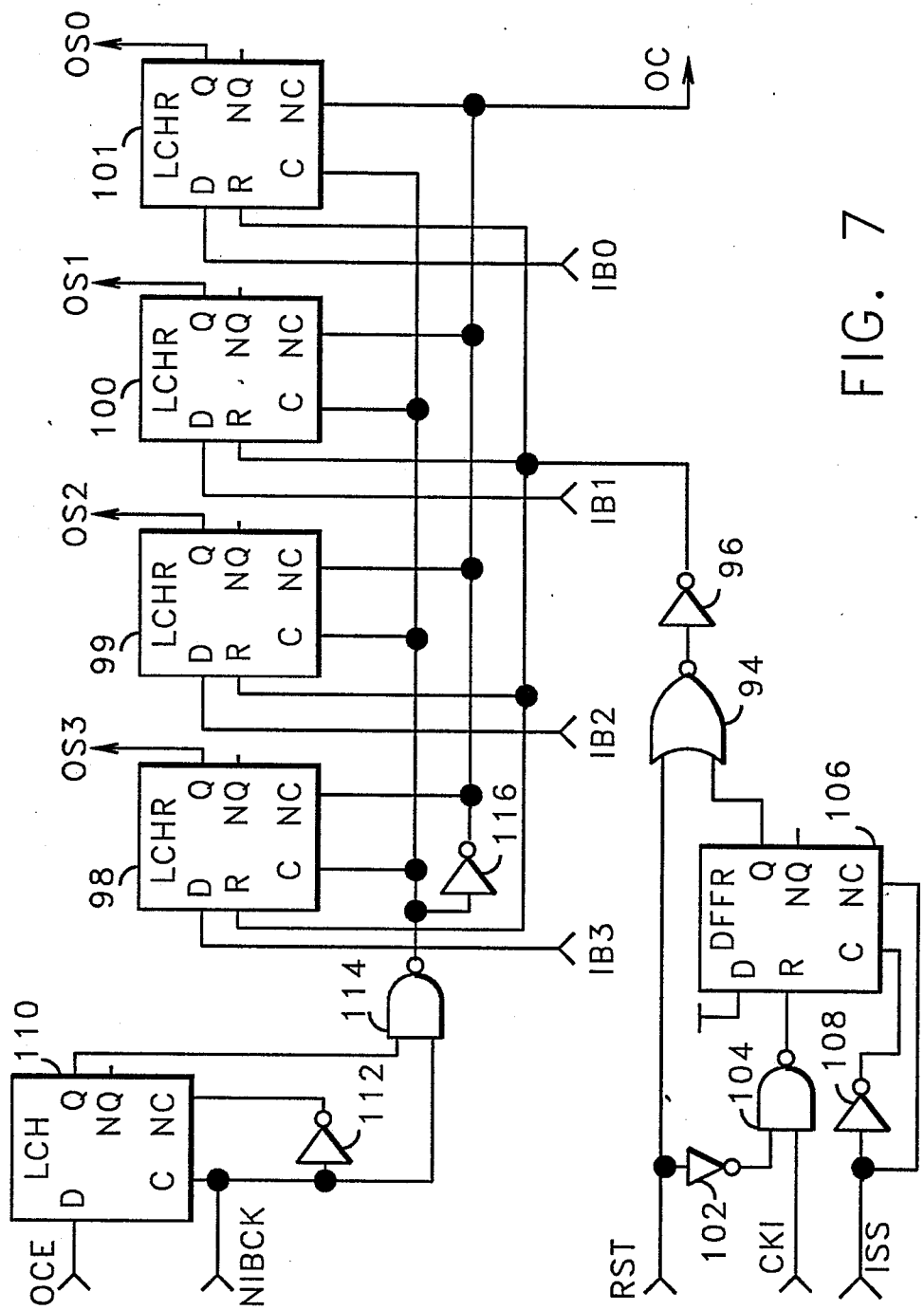
FIG. 7 is a circuit schematic of an operational register suitable for use in the interface controller embodiment of FIG. 2.

Referring back to FIG. 2, the parallel signal lines IB0-IB3 are coupled along with the signal lines RST, CKI, and ISS to a circuit denoted as OREG. The logic schematic of a suitable embodiment of an OREG circuit is shown in FIG. 7. Referring to FIG. 7, the RST signal is coupled through a NOR gate 94 and inverter gate 96 commonly to the reset inputs R of four D-type latches 98, 99, 100, and 101. In addition, the RST signal is coupled through another inverter gate 102, and a NAND gate 104 to the reset input R of a D-type flip-flop 106. The CKI signal is coupled to another input of the NAND gate 104 and the ISS signal is coupled directly to the NC input of the flip-flop 106 and through an inverter gate 108 to the C input thereof also. The Q output of the flip-flop 106 is coupled to another input of the NOR gate 94.

Referring still to FIG. 7, a nibble clock signal, denoted as NIBCK, generated by the MMU circuit (see FIG. 2) is coupled directly to the C input of another D-type latch 110 and through an inverter gate 112 to an NC input thereof. Still further, an operational code enable signal, denoted as OCE, which is generated by the DDU circuit (see FIG. 2) is coupled to the D input of the latch 110. The Q output of the latch 110 along with the NIBCK signal are coupled to respective inputs of a NAND gate 114, the output of which being commonly coupled to the C inputs of the latches 98–101 and indirectly coupled to the NC inputs thereof through another inverter gate 116. In addition, the parallel data lines IB3-IB0 are coupled to the D inputs of the latches 98–101, respectively. The Q outputs of the latches 98–101 are coupled to the data lines OS3-OS0, respectively, which conduct an operational code word to the MMU and DDU circuits of the interface controller 38 (see FIG. 2) where it is decoded.

In operation, each time the chip select signal SS is driven low by the central controller 12, the internal slave select signal ISS follows in state which causes the D flip-flop 106 to be clocked and to create a logical one at the Q output thereof. In response, assuming the signal RST a logical zero, the latches 98–101 are commonly reset by the reaction of the NOR gate 94 and inverter gate 96. Thereafter, the first clock pulse of the CKI signal, initiated by the SCK signal of the central controller 12, causes the flip-flop 106 to be reset forcing the Q output thereof to a logical zero which, in effect, relieves the forced reset condition of the latches 98–101 via gates 94 and 96 and permits the latches 98–101 to respond to the clocking signals effected by the NAND gate 114 to transfer the operational code word of IB-0-IB3 to the signal lines OS0-OS3, which operation will be described in greater detail hereinbelow.

Figure 8:
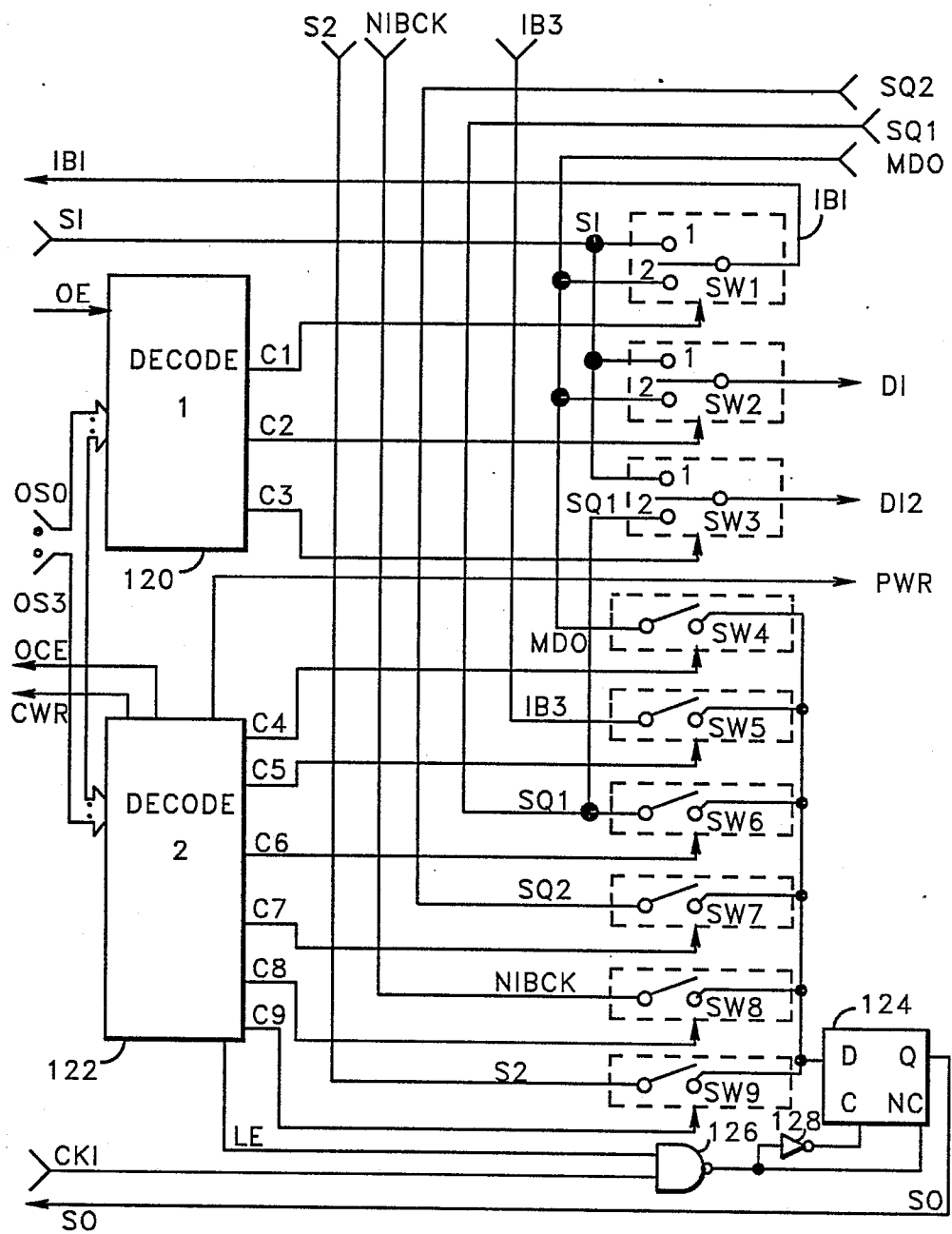
FIG. 8 is a functional block diagram schematic of a data direction unit suitable for use in the interface controller embodiment of FIG. 2.

As described hereabove, an operational code word is conducted over the signal lines OS0-OS3 to the data direction unit DDU along with the signals IB3, SI, NIBCK, and CKI (see FIG. 2). A block diagram schematic of a suitable DDU circuit is depicted in FIG. 8. Referring to FIG. 8, the operational code word OS-0-OS3 is coupled commonly to two decoder circuits depicted by the blocks 120 and 122. In addition, an operational enable signal, denoted as OE, generated by the MMU circuit (see FIG. 2), is coupled as an input to the decoder circuit 120. The decoder circuit 120 decodes the operational code word to effect three control signals C1, C2, and C3 which are coupled respectively to three single-pole-double-throw functional switches denoted as SW1, SW2, and SW3.

More specifically, positions 1 of the three switches SW1, SW2, and SW3 are commonly coupled to the signal line SI which is the internal serial bus over which serial data received from the central controller 12, via signal line SDI, is transferred (see FIG. 6). A signal denoted as MDO which is an output of a shift register circuit of the buffer memory 40 (refer to FIG. 4) is coupled commonly to position 2 of switches SW1 and SW2. The pole position of the switch SW1 is coupled to the internal bus interface line IBI which is coupled to the input of the serial shift register arrangement of D-type flip-flops 86–92 as shown in FIG. 6. The pole position of switch SW2 is coupled to a signal line, denoted as D1, which is coupled to the input of a shift register circuit of the PLL circuit 10 (refer to FIG. 3) and also to the shift register circuit of the buffer memory 40 (see FIG. 4). The output SQ1 of the shift register circuit of the PLL circuit 10 (see FIG. 3) is coupled to position 2 of the switch SW3 and the pole position thereof is coupled to the signal line, denoted as DI2, which is coupled to the input of a shift register included in the PLL circuit 14 (see FIG. 3). Accordingly, the switches SW1, SW2, and SW3 are controlled in one of either switch position 1 or switch position 2 by the signals C1, C2, and C3, respectively, in accordance with the decoding of the operational code word OS0-OS3 and the state of the signal OE via the decoder circuit 120.

In a similar manner, the decoder circuit 122 is operative to decode the operational code word OS0-OS3 to effect one of a set of signals C4-C9 which control the operation of a corresponding set of functional single-pole-single-throw switches SW4-SW9. The output of the switches SW4-SW9 are commonly coupled to a D input of a D-type latch 124. The signals MDO, IB3, SQ1, and NIBCK are coupled to the input ports of the switches SW4, SW5, SW6, and SW8, respectively. The output SQ2 of the shift register of the PLL circuit 14 (see FIG. 3) denoted as SQ2 is coupled to the input port of the switch SW7. In addition, a signal denoted as S2 which is generated by the MMU circuit (see FIG. 2) is coupled to the input port of the switch SW9. Other digital signals denoted as OCE, CWR, PWR, and LE are also generated by the decoder 122 in accordance with the code of the operational code word OS0-OS3. The signal OCE is coupled to the OREG circuit as described in connection with the embodiment of FIG. 7. The signal LE is coupled along with the internal clock signal CKI to respective inputs of a NAND gate 126, the output of which being directly coupled to the NC input of the latch 124 and indirectly coupled through the inverter gate 128 to the C input thereof. The Q output of the latch 124 is coupled to an internal serial output bus 50 of the interface controller 38 which is coupled back to the SPI circuit as shown in FIGS. 2 and 6.

Referring to FIG. 6, the SO signal bus line is coupled to one input of a NAND gate 130 and an input of a NOR gate 132. The ISS signal is coupled directly to the other input of the NOR gate 132 and also through an inverter gate 134 to the other input of the NAND gate 130. The output of the NAND gate 130 is coupled through a pair of cascadedly coupled inverter gates 136 and 138 to the gate of a PMOS transistor. Similarly, the output of the NOR gate 132 is also coupled through a pair of cascadedly coupled inverter gates 140 and 142 to the gate of an NMOS transistor. The sources of the transistors are coupled to a voltage supply and ground, respectively, and their drains are coupled together and to the SDO signal line. Accordingly, when the circuit is selected by ISS, signals conducted over the internal serial output bus SO are coupled through the respective gates 130-142 to operate the PMOS and NMOS transistors to transfer the serialized data word over the SDO signal line to the central controller 12. When the interface controller 38 is deselected, i.e. signal ISS driven high, the PMOS and NMOS transistors are non-conducting rendering the signal line SDO floating.

Referring back to FIG. 8, the decoder circuit 122 decodes the operational code word OS0–OS3 to effect a closure of one of the switches SW4–SW9 to permit the corresponding signal associated therewith conducted to the D input of the latch 124. Under a proper decoding sequence, the signal LE may be effected to a logical one to enable the NAND gate 126 to permit the internal clock signal CKI to clock the serial data appearing at the D input of the latch 124 to the Q output and signal line SO synchronously with the clock signal SCK of the central controller 12. The serialized data word may thus be transferred to the central controller 12 over the signal line SDO utilizing the circuitry described in connection with the embodiment of FIG. 6 hereabove. The operation of FIG. 8 will be more fully understood as the overall operation of the interface controller and frequency synthesizer are explained in greater detail herebelow.

Figure 9:
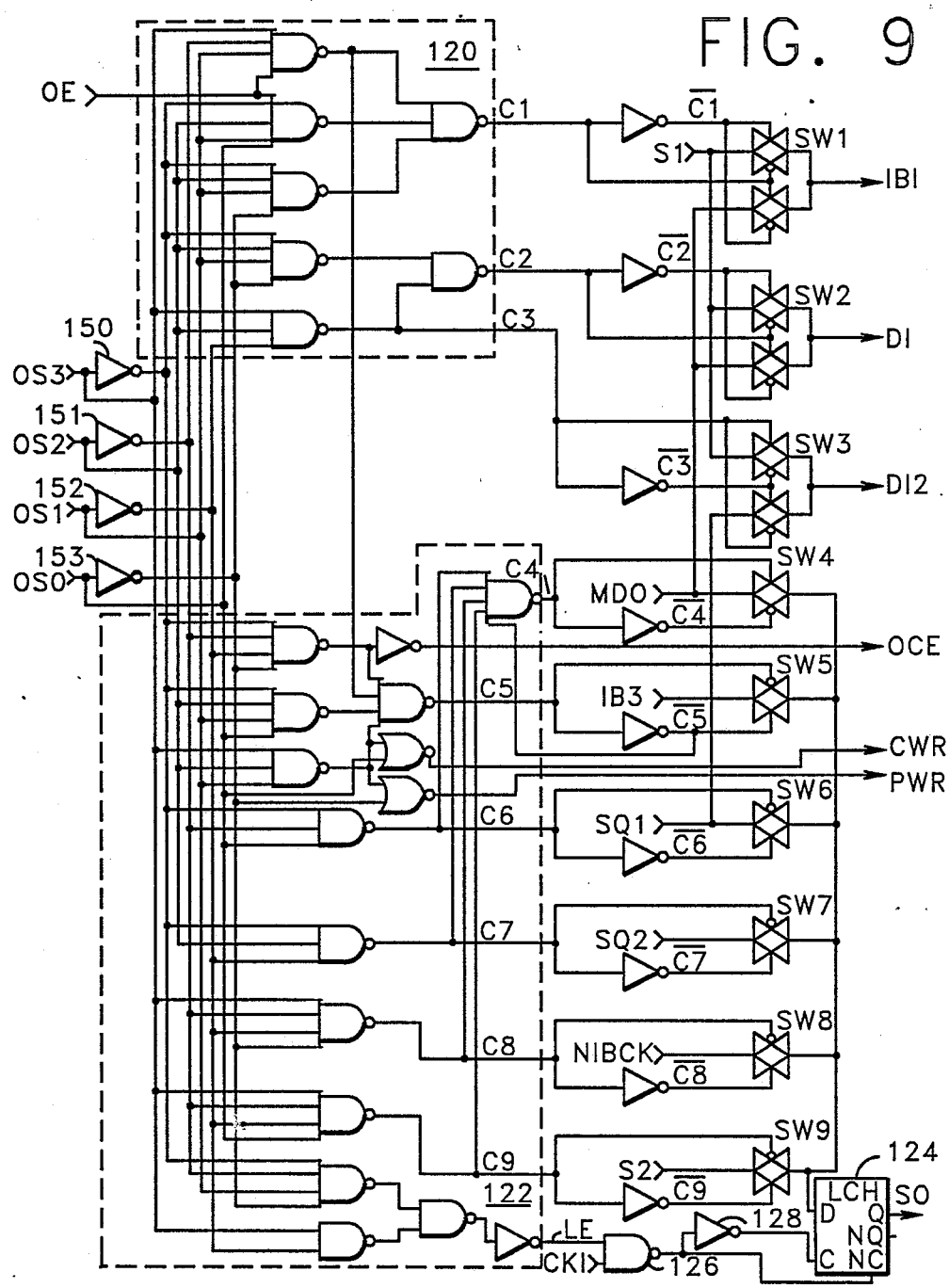
FIG. 9 is a circuit schematic of the data direction unit depicted in FIG. 8.

FIG. 9 is a logic circuit schematic depicting the embodiment of the data direction unit DDU of FIG. 8 in more specific detail. The digital bits OS3–OS0 of the operational code word are inverted by the inverter gates 150–153, respectively, to form the complements thereof. Accordingly, the digital signals OS3–OS0 and their corresponding complements are coupled to both of the decoder units 120 and 122, both of which being shown within dot-dashed lines. The decoder unit 120 comprises combinational logic utilizing NAND gates to effect the control signals C1, C2, and C3 which are inverted by corresponding inverter gates to effect the complements thereof. The control signals C1–C3 and their corresponding complements are coupled to conventional type analog gates arranged to form a single-pole-double-throw switch as described in connection with the embodiment of FIG. 8. The analog switches may be of the type manufactured by Motorola, Inc. bearing model number 14016. Similarly, the decoder unit 122 comprises combinational logic also utilizing NAND gates to form the control signals C4–C9 and also uses NOR gates to form the logic signals CWR and PWR and inverter gates to effect the signals OCE and LE as described in connection with the embodiment of FIG. 8. The control signals C4–C9 are inverted by corresponding inverter gates to form the complements thereof and, in each case, the control signal and its complement are used to control the respective single-pole-single-throw switch SW4–SW9, which switches may be of the same type as described for switches SW1–SW3. The remaining circuitry is the same as that described for the embodiment of FIG. 8.

Figure 10:
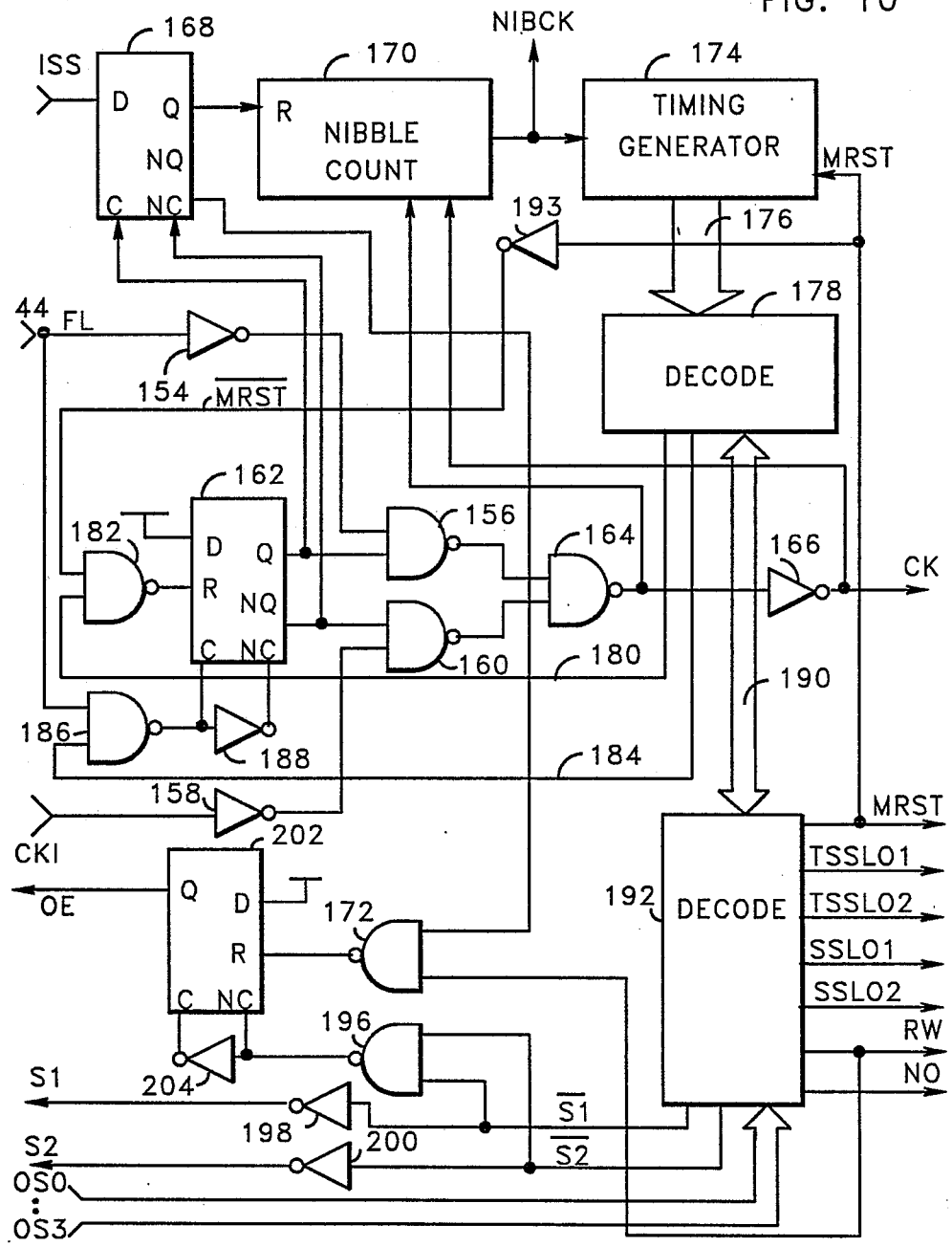
FIG. 10 is a functional block diagram schematic of a memory management unit suitable for use in the interface controller embodiment depicted in FIG. 2.

In FIG. 10 is shown a block diagram schematic of an embodiment of a memory management unit MMU suitable for use in the interface controller embodiment as shown in FIG. 2. In the present embodiment, an internal clock signal denoted as FL is derived in the reference counter 20 and coupled through signal lines 44 to the interface controller 38 and into the memory management unit MMU as shown in FIG. 2. The internal clock signal FL is coupled through an inverter gate 154 to one input of a NAND gate 156. The clock signal CKI, derived from the clock signal SCK received from the central controller 12 (see FIG. 6), is coupled through another inverter gate 158 to one input of a NAND gate 160. The Q and NQ outputs of a D-type flip-flop 162 are coupled to the other inputs of the NAND gates 156 and 160, respectively. The outputs of the NAND gates 156 and 160 are coupled to respective inputs of another NAND gate 164, the output of which being inverted by an inverter gate 166 to effect a clock signal, denoted as CK, which is distributed to the PLL circuits 10 and 14 and the buffer memory 40 (see FIGS. 2, 3, and 4).

Further, the Q and NQ outputs of the flip-flop 162 are coupled respectively to the C and NC inputs of another D-type latch 168, the D input of which being coupled to the internal chip select signal ISS. The Q output of the latch 168 is coupled to the reset input of a nibble counter, shown by the block 170, which is incremented in count according to the signal CK and its complement via gates 164 and 166. The NQ output of the latch 168 is coupled to one input of another NAND gate 172. The digital output of the nibble counter 170 effects the signal NIBCK which is provided as a clock input to a timing generator 174 which effects timing signals 176 in response to NIBCK, which timing signals are decoded by a decoder circuit 178. A first decoded signal 180 generated by the decoder circuit 178 is coupled to one input of a NAND gate 182, the output of which being coupled to the reset input of the flip-flop 162. A second decoded signal 184 generated by the decoder unit 178 is coupled to one input of another NAND gate 186, the output of which being coupled to the C input of the flip-flop 162 and also through an inverter gate 188 to the NC input of the flip-flop 162. Another input of the NAND gate 186 is coupled to the internal clock signal FL from the signal line 44.

Still further, the operational code word OS0–OS3 along with other timing signals 190 generated by the decoder 178 are coupled to another decoder circuit 192 which decodes such inputs to effect certain logic and timing signals which will be described in detail herebelow.

One of the signals generated by the decoder circuit 192 is a master reset signal, denoted as MRST, which is coupled to the shift register of the buffer memory 40 (see FIG. 4), to the timing generator 174, and to one input of the NAND gate 182 through an inverter gate 193. Other signals generated by the decoder circuit 192 are select signals for the latch registers of the PLL circuits 10 and 14, denoted as SSL01 and SSL02, respectively. Similar signals for selecting test registers (not shown) in the PLL circuits 10 and 14, denoted as TSSL01 and TSSL02, are also generated by the decoder circuit 192. A read/write signal RW and row decode enable signal NO are also generated by the decoder circuit 192 and provided to the buffer memory 40 for control thereof (see FIG. 4). The RW signal is also coupled to another input of the NAND gate 172.

Figure 4:
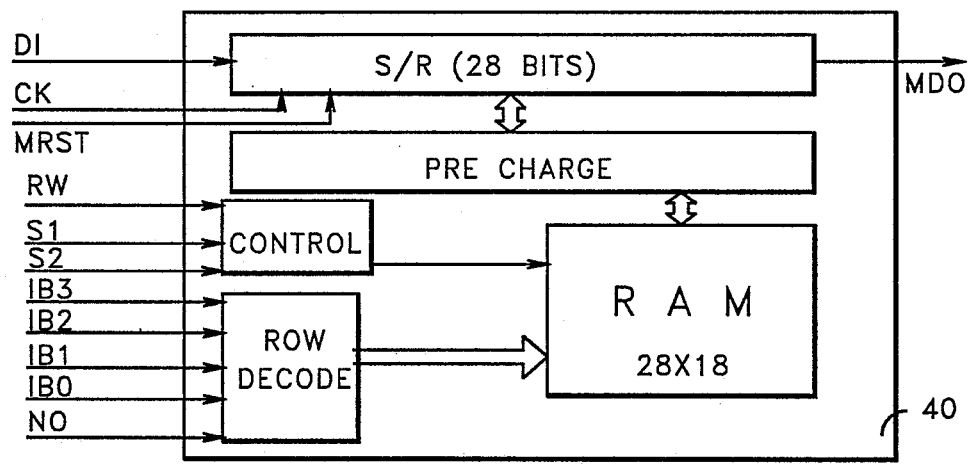
FIG. 4 is a block diagram schematic of a buffer memory suitable for use in the embodiment of FIG. 1.

Still further, timing signals $\overline{S1}$ and $\overline{S2}$ are generated by the decoder circuit 192 and coupled to respective inputs of a NAND gate 196 and also coupled through respective inverter gates 198 and 200 to effect the signals S1 and S2 which are provided to a control circuit of the buffer memory 40 (see FIG. 4). The timing signal S2 is also provided to the DDU circuit (refer to FIGS. 8 and 9). The output of the NAND gate 196 is coupled to the NC input of a D-type flip-flop 202 and the complement thereof via inverter gate 204 is coupled to the C input thereof. The output of the NAND gate 172 is coupled to the reset input of the flip-flop 202 and the D input thereof is coupled to a voltage level representative of a logical one. The Q output of the flip-flop 202 effects the output enable signal, denoted as OE, which is coupled to the SPI circuit (see FIG. 6).

In operation, when the interface controller 38 is selected by the central controller 12 via signal SS, the internal slave select signal ISS is driven to a logical low level. When the master reset signal MRST is relieved by the decoder circuit 192, the flip-flop 162 is enabled to change the state of its outputs Q and NQ in response to the clock signal FL via gates 186 and 188 under control of signal 184. The Q and NQ signals of flip-flop 162 are coupled to the clock inputs C and NC, respectively, of the latch 168 and cause the Q output thereof to follow the state of ISS which is a logical zero which permits the nibble counter 170 to count up from a zero count via the signal CK and its complement rendered by the gates 164 and 166. One of the gates 156 and 160 is selected by the Q and NQ outputs of the flip-flop 162 to permit either the internal clock signal FL or the central controller derived clock signal CKI to become the clock signal CK via gate 164. Each time the nibble counter 170 reaches a count of 4, a pulse is generated representing the signal NIBCK, which pulse also increments the timing generator 174 to effect the timing signals 176. The decoder 178 decodes the timing signals 176 to sequentially generate the signals 180, 184, and 190 which affect the states of the flip-flop 162 and the states of the output of the decoder 192 in conjunction with the code of operational code word OS0–OS3.

In addition, when the signal RW is in the read state and the interface controller 38 has been selected causing the NQ output of the flip-flop 168 to be driven to a logical one, the reset input of the flip-flop 202 is relieved via gate 172. Thereafter, when either S1 or S2 is generated, the flip-flop 202 is clocked by the gates 196 and 204 to cause the Q output or signal OE to be driven to a logical one.

Referring back to FIG. 7, when the operational code enable signal OCE is a logical one as generated by the DDU circuit (see FIGS. 8 and 9) in response to an all zero code of OS0–OS3, the Q output of the latch 110 follows in logical state. Accordingly, when the NIBCK signal is pulsed, a logical one is effected over signal line OC via gates 114 and 116. Referring back to FIG. 6, the signal line OC is coupled to the NC input of a D-type flip-flop 210 and also to the C input thereof through an inverter gate 212. The NQ output of the flip-flop 210 is coupled back to the data input thereof and also to one input of a NAND gate 214. The reset input of the flip-flop 210 is coupled to tee signal ISS. The signal OE generated by the MMU circuit (see FIG. 10) is coupled to another input of the NAND gate 214, the output of which being coupled to one input of a NOR gate 216 and also to one input of a NAND gate 218 through an inverter gate 220. The serial output line S0 is coupled to another input of both of the gates 216 and 218. The output of gate 218 is coupled to the gate of a PMOS transistor through a pair of cascadedly coupled inverters 220 and 222. Similarly, the output of the gate 216 is coupled to the gate of a NMOS transistor through another pair of cascadedly coupled inverters 224 and 226. The sources of the PMOS and NMOS are coupled to a voltage supply line and ground, respectively, and the drains thereof are coupled together and also coupled to the SDI line.

In operation, the SDI line may be selected to be bidirectional by the control signals OE and OC, that is, the central controller 12 can read data from the interface controller 38 as well as write data thereto over the SDI line. When the central controller 12 is writing data words to the interface controller 38, the PMOS and NMOS transistors are both turned off rendering a very high impedance or floating output thereof. On the other hand, when the central controller 12 intends to read data words from the interface controller 38, the control signals OE and OC govern the flip-flop 210 and NAND gate 214 to their proper states for enabling the gates 216 and 218 to respond to the digital data information of the serial output line S0 to correspondingly control the PMOS and NMOS transistors to pulse the signal line SDI in accordance with the digital signals of the signal line S0.

Figure 11:
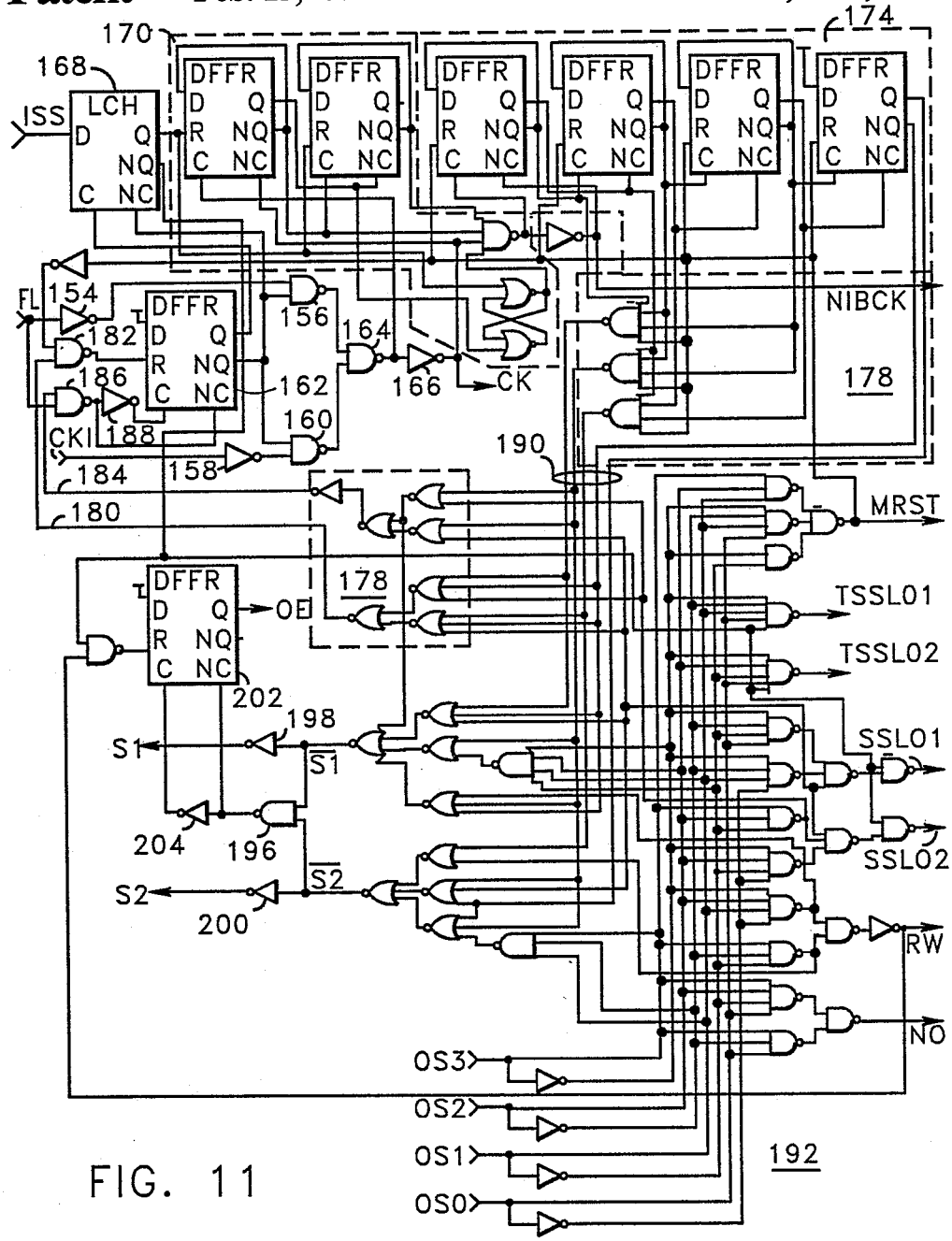
FIG. 11 is a circuit schematic of the memory management unit shown in FIG. 10.

A more detailed logic schematic diagram depicting the embodiment of the MMU circuit of FIG. 10 is shown in FIG. 11. The same reference numerals are used for the previously described signal lines and logic components thereof. For example, the nibble counter 170 and timing generator 174 are shown enclosed by dot-dashed lines each comprising a conventional arrangement of D-type flip-flops. Also, the decode circuits 178 are shown enclosed by dot-dashed lines each comprising combinational logic using NAND gates and NOR gates. The remaining circuitry comprises substantially the decoder unit 192 which comprises conventional combinational logic utilizing interconnected NAND gates for decoding the operational code word OS0–OS3 and the complements thereof and the timing signals 190 sequentially generated by the decoder circuitry 178. The circuitry of FIG. 11 operates in the same manner as described for the embodiment of FIG. 10.

Figure 14:
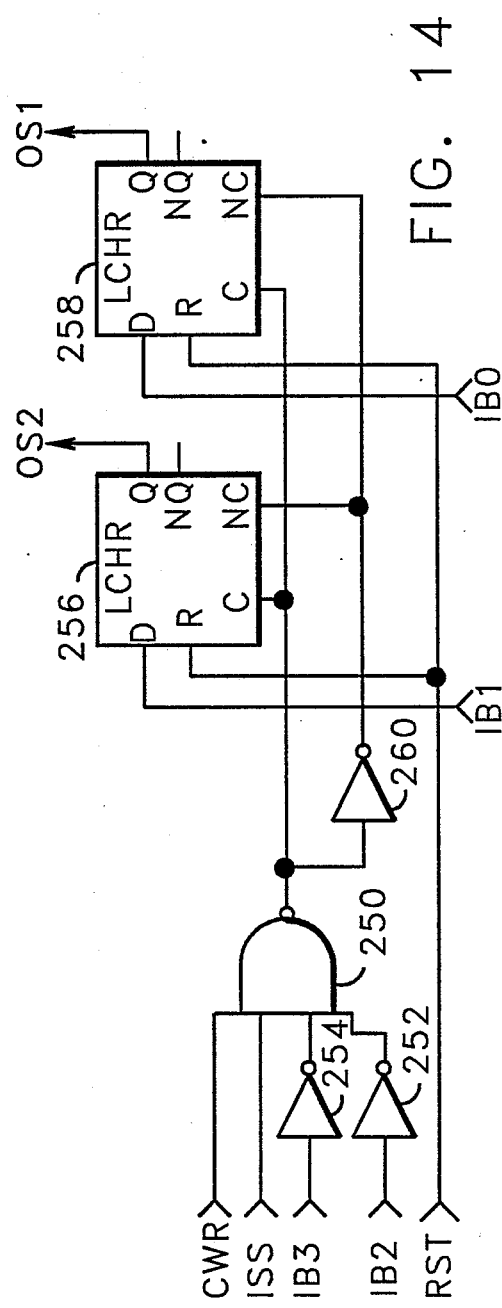

FIGS. 12, 13, and 14 depict circuit schematic diagrams of embodiments of control registers CREG1, CREG2, and CREG3 suitable for use in the interface controller 38 as depicted in FIG. 2. Referring to FIG. 12, signals CWR, ISS, and IB3 are coupled to respective inputs of a NAND gate 230. The output of the NAND gate 230 is commonly coupled to the C input of a set of D-type latches 232, 234, and 236 and also coupled commonly to the NC input of the same latch through an inverter gate 238. The RST signal is coupled to the reset inputs of the latches 232, 234, and 236. The digital signals IB0, IB1, and IB2 are coupled to the D inputs of the latches 236, 234, and 232, respectively. The Q outputs of the latches 236 and 234 become the signals BS1 and BS2 which are provided to the loop bias control 24 over signal lines 46 for characterization thereof. The Q output of the flip-flop 232 becomes the signal OPON which is provided to the operational amplifier 28 over signal line 48 for the characterization thereof.

Referring to FIG. 13, the signals CWR, ISS, and IB2 are directly coupled to respective inputs of another NAND gate 240 and the signal IB3 is coupled to a fourth input thereof through an inverter gate 242. The output of the NAND gate 240 is coupled commonly to the C input of two D-type latches 244 and 246 and also coupled commonly to the NC inputs thereof through an inverter gate 248. The RST signal is coupled commonly to the reset inputs of the latches 244 and 246. The digital signals IB0 and IB1 are coupled to the D inputs of the latches 246 and 244, respectively. The Q outputs of the latches 246 and 248 become respectfully the digital signals OSD and OSN which are provided to the reference oscillator 16 over signal lines 42 for the characterization thereof. Referring to FIG. 14, the signals CWR and ISS are directly coupled to respective inputs of a NAND gate 250 and signals IB2 and IB3 are coupled to third and fourth inputs of the same NAND gate through inverter gates 252 and 254, respectively. The signal RST is coupled commonly to the reset inputs of D-type latches 256 and 258. The output of the NAND gate 250 is coupled to the C input of the latches 256 and 258 and also to the NC input thereof through an inverter gate 260. The digital signals IB0 and IB1 are coupled to the D inputs of the latches 258 and 256, respectively. The Q outputs of the latches 258 and 246 become the signals OS1 and OS2, respectively, and are provided to the reference counter 20 over signal lines 44 for the characterization thereof.

Figure 15:
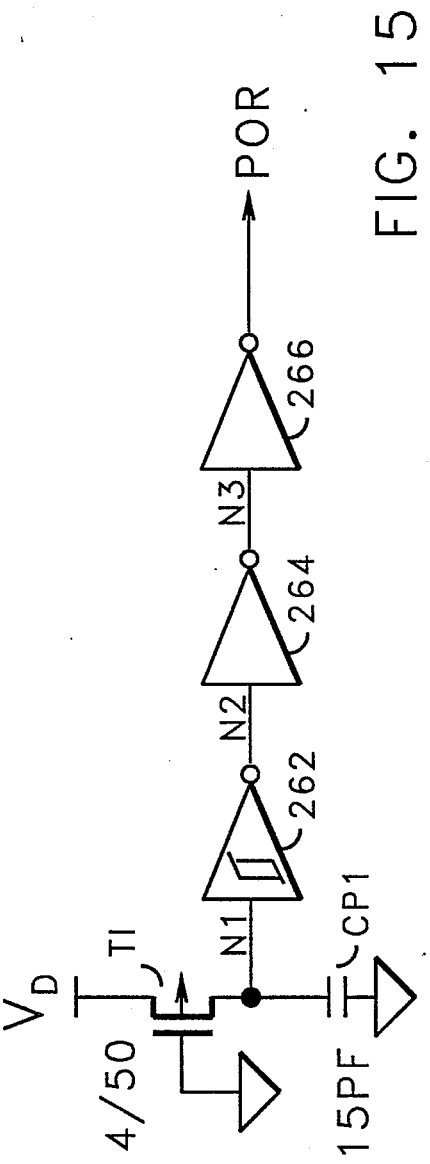
FIG. 15 is a circuit schematic of a power on reset circuit suitable for use in the interface controller embodiment of FIG. 2.

A suitable circuit embodiment for the power on reset circuit for the interface controller 38 as shown in FIG. 2 is depicted by the circuit schematic of FIG. 15. Referring to FIG. 15, a PMOS transistor T1 is coupled in series with a capacitor CP1 between the voltage supply $V_D$ and ground potential. The node between T1 and CP1 is coupled to the input of a Schmitt-trigger type inverter 262 which is cascadedly coupled to a pair of inverters 264 and 266 to effect the signal POR which is provided to the SPI circuit (refer to FIG. 6). In operation, as the voltage level $V_D$ causes the voltage across the capacitor CP1 to exceed the threshold level of the Schmitt-trigger inverter 262, the output thereof is driven to a logical zero. This results in the output signal POR to eventually also go to a logical zero which is the active state thereof. As shown in the circuit diagram of FIG. 6, when the POR signal is a logical zero, the flip-flops 64 and 86–92 are rendered active by relieving the reset control thereof. Such flip-flops can thereafter respond to the signals coupled to the clocking and data inputs thereof. In the present embodiment, the operational code word is a 4-bit digital code representing 16 possible operations which are illustrated in the table of FIG. 16. The various switch connections formed by the DDU circuit of the interface controller 38 in response to the 16 possible operational codes are shown by the table of FIG. 22, and the serial data transfer protocols in transferring data among the central controller 12, PLL circuits 10 and 14, and memory 40, are shown by FIGS. 17–21. FIGS. 16–22 will be referred to in the following exemplary description of operation.

Referring to the table of FIG. 16, the SPIO enable operation denoted by the operational code of all zeroes (IOE) permits the interface controller to be converted from a four-wire interface, i.e. utilizing the SDO line, to a three-wire interface, i.e. making the SDI line bidirectional. Under this condition, the SDI line only becomes bidirectional during a read mode (172, 202 of FIG. 10) of a read-type operational code as will be described in greater detail herebelow. To read data from the SDI line, the IOE operational code word must be received by the interface controller 38 previous to the read operational code word and corresponding data word (refer to FIG. 18). At the end of the data transfer from the central controller 12 to the interface controller 38 via the SDI line, the control signals OE and OC are activated by their corresponding generating circuits and govern the states of the flip-flop 210 and NAND gate 214 which enable gates 216 and 218 and cause the SDI line to become bidirectional at the next clock edge of the SCK signal (refer to FIG. 6). The SDI line will remain an output until the interface controller is deselected via signal SS and corresponding internal signal ISS which controls the state of flip-flop 210 to disable gates 214, 216, and 218.

When the interface controller 38 is selected, the operational code word OS0–OS3 is forced to all zeroes by resetting the registers 98–101 (see FIG. 7). Referring to FIG. 22, the switch SWI of the DDU circuit is switched to position 1 in response to the all zero operational code word IOE. Accordingly, serial data input over the SDI line and correspondingly over the SI line is conducted to the IBI line and the first four bits thereof (i.e. IOE code) are clocked into the registers 86, 88, 90, and 92 and converted to the parallel bits IB0–IB3 thereby. The clocking operation is performed by the central controller generated signal SCK via gates 74 and 76 which is synchronized to the digital data bits transferred over the SDI line. The parallel IOE code is conducted over signal lines IB0–IB3 to the data inputs of the registers 101, 100, 99, and 98 of the OREG circuit (see FIG. 7) in accordance with the following conditions. Since the initial code of OS0–OS3 was reset to all zeroes upon selection, the OCE signal remains a logical one and after the four bits of serial operational code are transferred via IBI to registers 86–92, a pulse is generated by the MMU circuit (170) over the signal line NIBCK. The latch 110 of FIG. 7 responds by setting the Q output thereof to a logical one creating a pulse at the output of gates 114 and 116 which pulse latches the operational code bits presented to the data inputs of the corresponding registers via IB0–IB3. Thus, the operational code word OS0–OS3 becomes that which presented to the registers over the parallel lines IB0–IB3 under the foregoing described conditions.

Since the data over the lines IB0–IB3 is all zeroes for the operational code of IOE, the operational code word remains all zeroes after latch, and switch SWI of the DDU circuit remains in position 1. Under these same conditions, the decoder 122 responds to the all zero IOE code (see FIG. 22) and closes switch SW5 and sets signal LE to a logical one. Thus, the output register 92 via IB3 is connected to the serial output line S0 through the D latch 124 which is clocked by the clocking signal CKI. Under these conditions, the interface controller 38 is prepared to accept the successively transmitted read operational code from the central controller 12 according to the protocol of FIG. 18. In the present embodiment, there are three read operations MR1, MR20, and MR21 (see FIG. 16). Starting with MR1, the operational code 0111 corresponding thereto may be followed by a corresponding 4-bit data word which uniquely identifies one of 16 registers in the buffer memory 40 corresponding to the characterization data word of the PLL circuit 10 desired to be read by the central controller 12. The operational code 0111 is conducted serially through switch SWI and shifted into the registers 86–92 by the clock signal CKI where it is converted to a parallel word and transferred to the registers 98–101 as described above. The succeeding four bits of data are then clocked into the registers 86–92 and are transferred in parallel to the buffer memory 40 over the data bus IB0–IB3 to a row decode circuit thereof (see FIG. 4). The MMU circuit (FIG. 10) responds to the operational code 0111 to generate the appropriate control signals of MRST, RW, S1, S2, and NO which control signals cause the buffer memory 40 to transfer in parallel format the characterization data word from the memory register designated by the address of signal lines IB0–IB3 through a precharger to the shift register circuit S/R thereof.

In addition, the decode circuits 120 and 122 of the DDU circuit (FIG. 8) respond to the operational code 0111 to switch SW1 to position 2 coupling the output MDO of the shift register of the buffer memory 40 to the IBI line and also to couple the signal IB3 via switch SW5 to the latch 124. The logical control signal LE is also effected to a logical one to enable the gate 126 to respond to the clock signal CKI. In this state, the characterization data word in the shift register S/R of the buffer memory 40 may be shifted out serially by the clock signal CK over the lines MDO and IBI, through the registers 86–92, through switch S5 via IB3 and latch 124, over the signal line SO, through the gates 218 and 216 to the selected bidirectional line SDI or the SD0 line and to the central controller 12. In the read memory L01 serial protocol as shown in FIG. 20, the characterization data word is preceded by the address data word which resides in the registers 86–92 at the commencement of the transfer. After 32 clock pulses, the central controller 12 disables further clocking and the interface controller 38 is deselected by the signal SS.

In the present embodiment, there are only two registers of the buffer memory 40 which uniquely correspond to characterization data words of the PLL circuit 14. Accordingly, to read one or the other of the two registers, only an operational code word is needed, either MR20 or MR21. The least significant bit of the operational code word may be changed between zero and one to effect the selection of the desired register of the buffer memory 40. The operational code words corresponding to reading the contents of these two registers by the central controller are (MR20) 1010 and (MR21) 1011 and are both followed by a corresponding data word of all zeroes (refer to FIG. 16). As shown in the table of FIG. 22, the DDU circuit responds to the operational code words of MR20 and MR21 by forming the same connections as for the foregoing described operation of MR1. In the read memory L02 serial protocol as shown in FIG. 21, the characterization data word is preceded by all zeroes which reside in registers 86–92 at the commencement of the transfer.

Another set of operational codes allow the central controller 12 to directly load a characterization data word into a storage register of one of the PLL circuits 10 or 14 or into a storage register of the buffer memory 40. For example, the operational code 0001 (L1S) permits a direct load from the controller 12 to the shift register of the PLL circuit 10 (see FIG. 3). For this operation, the protocol of the transfer which is shown in FIG. 17 permits the 4-bit operational code to be followed directly with the characterization data word of, for the present embodiment, 28 bits. For example, the operational code word 0001 (L1S) is first transferred from the central controller 12 and winds up stored in the registers 101–98 of the OREG circuit (see FIG. 7). The DDU circuit (see FIG. 8) responds to the operational code word of L1S (see FIG. 22) by positioning switch SW2 to position 1 which connects the serial input line SI to the DI line which is the input to the shift register of the PLL circuit 10 by connecting the output line of the shift register SQ1 through switch 6 to the D latch 124, coupling it to the SO line, and by driving the signal LE to a logical one. During the transfer over signal SI, the shifting of the information from line DI via SW2 into the shift register of circuit 10 is controlled using the clock signal CK which is derived from the signal CKI generated by the central controller 12 via SCK. After 28 clock pulses, the timing generator 174 inhibits further transfer. During the transfer operation, the signal SSL01 disconnects the latch registers of the circuit 10 from the shift register thereof, and upon completion of the transfer of the characterization data word, the interface controller 38 may be deselected and the signal SSL01 transfers the newly loaded characterization data word of the shift register to the various circuits of the PLL circuit 10 for characterization in generating the synthesized channel frequency signal thereof.

In a similar manner, using the operational code 0100 (L2S), the shift register of the PLL circuit 14 may be directly loaded from the central controller 12. In this operational state (see FIG. 22), switch S3 is controlled to connect the DI2 line to the SI line to permit the serial characterization data to flow to the shift register of the circuit 14. Correspondingly, the output line SQ2 of the shift register of circuit 14 is coupled to the SO line by switch SW7 and latch 124. Test registers (not shown) of the PLL circuits 10 and 14 may also be loaded directly from the central controller using the operational code 0011 and 0101, respectively.

In addition, the central controller 12 may direct the loading of characterization data words designated for either the PLL circuit 10 or the PLL circuit 14 into storage registers of the buffer memory 40 which have been preassigned therefor. In the present embodiment, 16 registers of the buffer memory 40 have been preassigned for buffer storage of characterization data words designated for the PLL circuit 10 and two registers have been preassigned for buffer storage of characterization data words designated for the PLL circuit 14. The operational code 0110 (MW1) directs the interface controller 38 to transfer characterization data words from the central controller 12 to the buffer memory 40 in a storage register uniquely identified by a corresponding data word. The serial data transfer protocol for this operation is shown in FIG. 19.

In operation, the operational code word for MW1 is transferred first followed by four bits of all zero. The operational code MW1 winds up in the registers 101–98 (see FIG. 7). The four zeroes are followed by a corresponding data word which winds up in the registers 86–92, the outputs of which being conducted to the row decoder of the buffer memory 40 over parallel lines IB0–IB3 to act as an address therefor. The MMU circuit responds to the operation code 0110 to generate the proper signals for MRST, RW, S1, S2, and N0 to render the buffer memory 40 in condition to serially receive the characterization data word in the shift register S/R over the data line DI using selected clock signal CKI. In addition, the DDU circuit control switch SW2 to position 1 to couple the serial input line SI to the DI line and control switch SWI to position 2 to couple the output MDO of the shift register to the IBI line (see FIG. 22). Also, switch SW4 is closed to couple the output of the shift register MDO to the line SO through the latch 124. The signal LE is rendered to a logical one to enable clocking of the latch 124. After the transfer of the characterization data word is complete, the signals RW, S1, and S2 are controlled to transfer the loaded characterization data word in parallel from the shift register to the storage register uniquely identified by the address over the data lines IB0–IB3 (see FIG. 4). Thereafter, the interface controller 38 may be deselected or another storage register address and corresponding characterization data word transferred in the same manner (see the protocol in FIG. 19).

To write characterization data words into the two memory locations designated for the PLL circuit 14, the operational code may be set to either 1000 (MW20) or 1001 (MW21). The least significant bit of the operational code designates the proper storage register in the memory 40. According to the serial transfer protocol for this operation, the operational code word may be serially followed by the 28 bits of characterization data word as shown in FIG. 17. The MMU circuit, as described above, similarly generates the proper control signals to operate the circuits of the buffer memory 40 in performing the serial to parallel conversion and the transfer of the parallel formatted characterization data word to its uniquely identified storage register.

The interface controller 38 also responds to a single operational code L1M and corresponding data word to automatically direct a transfer of a characterization data word serially from the buffer memory 40 to the PLL circuit 10. For example, the operational code 0010 (L1M) may be followed by a 4-bit memory address uniquely identifying the storage register of the buffer memory containing the characterization data word to be transferred to the circuit 10. As described above, the operational code word winds up in the registers 101-98 and the address data word winds up in the registers 86-92. The MMU circuit as described in connection with FIG. 10 directs the transfer by sequencing the proper control signals. However, during this transfer, the clock signal CK is not derived from the central controller but rather derived from the internal clock signal FL as selected by the flip-flop 162. The clock signal FL may be orders of magnitude faster than the clock signal derived from the central controller.

In the present embodiment, the interface controller 38 may be deselected immediately upon transfer of the operational code word and corresponding address by the central controller 12, in which case, the latch registers of the circuit 10 are operated by the signal SSL01 to receive the parallel formatted characterization data word from the corresponding shift register immediately upon completion of the transfer thereto from the memory 40. However, the select signal SS from the central controller 12 may be maintained for a time beyond the transfer of the operational code and corresponding data word, in which case, the transfer of the characterization data word from the shift register to the latch registers of circuit 10 will not take place until the central controller 12 deselects via signal line SS. The signal SSL01 under these conditions follows the deselection signal SS or ISS.

The interface controller 38 is further operative to direct the transfer of characterization data words to both of the shift registers of the PLL circuits 10 and 14 in response to a single operational code CS0 or CS1. In the present embodiment, these codes are 1100 (CS0) and 1101 (CS1) followed by the corresponding 4-bit address which uniquely identifies the storage register of the buffer memory which contains the characterization data word to be transferred to the shift register of the PLL circuit 10. Correspondingly, the least significant bit of the operational code CS0 or CS1 (refer to FIG. 16) designates the storage register of the characterization word to be loaded into the shift register of the PLL circuit 14. Upon transfer from the central controller, the operational code word and corresponding address word wind up in the appropriate registers as described hereabove. In response to the operational code word, the MMU and DDU circuits cause the connections as shown in FIG. 22 and generate the proper timing control signals to effect the transfer as hereinafter described.

More specifically, the output MDO of the shift register of the buffer memory 40 is coupled to the signal line DI by switch SW2 and conducted to the input of the shift register of the PLL circuit 10. The output SQ1 of the shift register of circuit 10 is coupled by switch SW3 to the signal line DI2 which is the input of the shift register of the circuit 14. In operation, the characterization data word in the storage register of memory 40 designated by the least significant bit of the operational code word either CS0 or CS1 is transferred in parallel format to the shift register of the buffer memory 40 and serially shifted from the shift register of the memory 40 to the shift register of the PLL circuit 10 utilizing the internal clock signal FL as selected by the flip-flop 162 in the MMU circuit. Thereafter, the characterization data word uniquely identified by the address lines IB0-IB3 is transferred in parallel format to the shift register of the buffer memory 40 and shifted out serially to the shift register of the circuit 10 utilizing the same clock signal FL. Concurrently therewith, the characterization data word of the shift register of circuit 10 is shifted serially to the shift register of the circuit 14 also using clock signal FL. At the end of 28 clock pulses, the specified characterization data words reside in the proper shift registers of the circuits 10 and 14 and the corresponding latch registers thereof may be controlled to transfer the characterization data word to the PLL circuitry using the control signals SSL01 and SSL02, respectively.

Another operational code word directs the interface controller to write data to the various control registers CREG1, CREG2, and CREG3 as depicted in the FIGS. 12, 13, and 14, respectively. To initiate this operation, the four bits of operational code 1110 (CWR) are serially transferred from the central controller 12 to the interface controller 38 first, followed by a corresponding 4-bit data word which is referred to, in this operation, as the control word. The states of the most significant bit or a combination of the most significant and next most significant bits of the control word select the designated control register and the states of the remaining bits are stored in the registers thereof. In operation, the operational code word winds up in the registers 98-101 of the OREG circuit (see FIG. 7) and the following 4-bit control word winds up in the registers 86-92 of the SPI circuit (see FIG. 6). The operational code word CWR is decoded by the decoder circuit 122 to generate the signal CWR which is provided along with the signal ISS to the logic select circuits 230, 240, and 250 of the control registers CREG1, CREG2, and CREG3, respectively, for enablement thereof.

If the most significant bit of the control word provided over signal line IB3 is a logical one, the gate 230 becomes responsive and gates 240 and 250 remain unresponsive. The data presented on lines IB0-IB2 are thus clocked into the registers 236, 234, and 232 of CREG1 by the gates 230 and 238. The Q outputs of these registers are thus updated according to the states of their corresponding bits of the control word. Similarly, if the most significant bit of the control word is a logical zero and the next most significant bit thereof is a logical one, then the gate 240 becomes responsive and gates 230 and 250 remain unresponsive. Under this condition, the data presented on lines IB0 and IBI are clocked into registers 246 and 244 of CREG2 by the gates 240 and 248. Finally, if the states of the most significant bit of the control word and next most significant bit are both logical zero, the gate 250 becomes responsive and gates 230 and 240 remain unresponsive. Under this condition, gates 250 and 260 clock into the registers 258 and 256 the digital states of the signal lines IB0 and IB1 for storage therein. In this manner, a control word may be transferred to a selected control register under control of the central controller 12 utilizing the interface controller 38.

Figure 5:
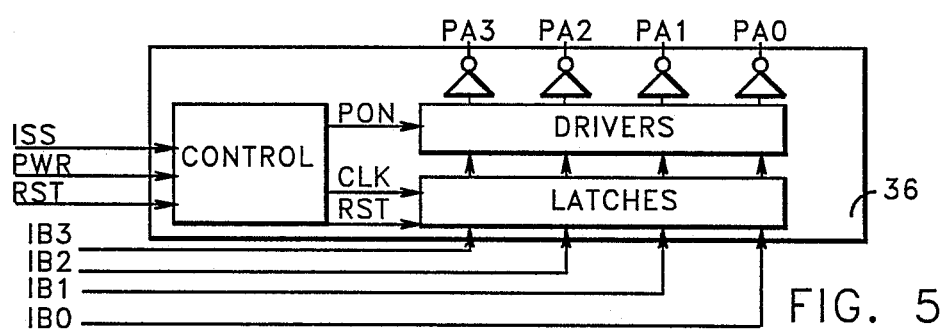
FIG. 5 is a block diagram schematic of a digital data output circuit suitable for use in the embodiment of FIG. 1.

The final of the operational codes 1111 directs the interface controller 38 to transfer a corresponding data word to the digital output port circuitry 36. The serial transfer protocol from the central controller is the same as that for the control write, that is, the four bits of operational code are transferred first followed by four bits of a corresponding data word which is referred to as port data. The operational code word and corresponding data word wind up in their corresponding registers as described above and the signal lines IB-0–IB3 are provided to a set of latch registers in the port circuit 36 as shown in FIG. 5. The decoder circuit 122 of the DDU circuit decodes the operational code word PWR and generates the signal PWR. The signal PWR along with the select signal ISS are provided to a control circuit in 36 (see FIG. 5) to enable the latch registers thereof to store the data word of line IB0-IB3. A set of driver circuits are provided to transfer the digital code word of the latch registers to their corresponding digital output lines PA3-PA0.

While the present invention has been described in connection with a specific embodiment hereabove, it is understood that additions, modifications, and substitutions may be made thereto without deviating from the broad principles of the present invention. Accordingly, the present invention should not be limited to any single embodiment, but rather construed in breadth and scope in accordance with the recitation of the claims appended hereto.

What is claimed is:

1. A frequency synthesizer including at least one phase lock loop (PLL) circuit operationally characterized by a central controller to generate a synthesized channel frequency signal, said PLL circuit including at least one storage register dynamically programmable with data words which characterize the operation of said PLL circuit in generating said synthesized channel frequency signal, said frequency synthesizer comprising:

an interface controller coupled between said central controller and said at least one storage register of said PLL circuit and operative to receive operational code words and data words from said central controller; and a buffer memory coupled to said interface controller for storing a plurality of data words for characterizing the operation of said phase lock loop, said interface controller responsive to said operational code words received from said central controller to direct a transfer of data words between said central controller, said at least one storage register and said buffer memory.

2. The frequency synthesizer in accordance with claim 1 wherein the interface controller includes:

first means selectively operative to couple the central controller to the at least one storage register and to control the transfer of a data word therebetween;

second means selectively operative to couple the central controller to the buffer memory and to control the transfer of a data word therebetween;

third means selectively operative to couple the buffer memory to the at least one storage register and to control the transfer of a data word therebetween; and means for decoding an operational code word received from the central controller and for selecting one of said first, second and third means to perform its specified operation based on said decoded operational code word.

3. The frequency synthesizer in accordance with claim 2 wherein the operational code words and data words are transferred in a serial format among the central controller, the interface controller, the buffer memory and the at least one storage register.

4. The frequency synthesizer in accordance with claim 3 wherein the interface controller includes four ports for coupling to the central controller—first port for receiving from the central controller a select signal, second port for receiving from the central controller a clock signal which synchronizes the serial transfer of operational code words and data words, third port for receiving operational code words and data words from the central controller in a serial format, and fourth port for sending data words to the central controller in a serial format.

5. The frequency synthesizer in accordance with claim 4 wherein the interface controller includes means for selectively converting the third port into a bidirectional serial word transfer port for both sending and receiving words of a serial format.

6. The frequency synthesizer in accordance with claim 3 wherein the interface controller includes three ports for coupling to the central controller—first port for receiving a select signal, second port for receiving a clock signal which synchronizes the serial transfer of operational code words and data words, and third port for bidirectionally sending and receiving words of a serial format respectively to and from the central controller.

7. The frequency synthesizer in accordance with claim 3 wherein the decoding means includes:

a shift register for receiving from the central controller an operational code word in a serial format and converting the operational code word to a parallel format;

a latch register coupled to said shift register for storing the parallel formatted operational code word; and means for decoding the operational code word stored in said latch register and for selecting one of the first, second and third means to perform its specified operation based on said decoded operational code word.

8. The frequency synthesizer in accordance with claim 7 wherein the interface controller includes means for receiving a select signal and a clock signal from the central controller; wherein the shift register is synchronized by said clock signal to serially receive an operational code word from the central controller; and wherein the latch register is governed by the select signal to preset an operational code word into the latch register, which preset code word being decoded to render a coupling between the central controller and the shift register for synchronous reception of the operational code word.

9. The frequency synthesizer in accordance with claim 1 including means for generating a reference frequency signal for the PLL circuit in accordance with a programmed, characterization, and an associated storage register dynamically programmable with a data word which characterizes the operation of said generating means; and wherein the interface controller is coupled to said associated storage register and is responsive to an operational code word received from the central controller to direct a transfer of a data word between the central controller and said associated storage register.

10. The frequency synthesizer in accordance with claim 1 including means for generating a loop bias control signal for the PLL circuit in accordance with a programmed characterization, and an associated storage register dynamically programmable with a data word which characterizes the operation of said generating means; and wherein the interface controller is coupled to said associated storage register and is responsive to an operational code word received from the central controller to direct a transfer of a data word between the central controller and said associated storage register.

11. A frequency synthesizer including at least one phase lock loop (PLL) circuit operationally characterized by a central controller to generate a synthesized channel frequency signal, said PLL circuit including at least one storage register dynamically programmable with data words which characterize the operation of said PLL circuit in generating said synthesized channel frequency signal, said frequency synthesizer comprising:
   an interface controller operative to receive operational code words, corresponding data words, and characterization data words from the central controller; and
   a buffer memory coupled to said interface controller for storing a plurality of characterization data words in a corresponding plurality of registers, each such data word corresponding to a unique characterization of operation of said PLL circuit in generating said synthesized channel frequency signal, said interface controller responsive to a first operational code word and corresponding first data word to transfer a characterization data word from said central controller to said buffer memory for storage in a register uniquely corresponding to the code of said first data word, and responsive to a second operational code word and corresponding second data word to transfer a characterization data word from a register of said buffer memory corresponding uniquely to the code of the second data word to said at least one storage register of said PLL circuit, whereby said at least one storage register of the PLL circuit is dynamically programmed with the transferred characterization data word from the buffer memory.

12. The frequency synthesizer in accordance with claim 11 wherein the buffer memory includes a shift register which is operative to convert a data word from a serial format to a parallel format for storage in a register of the buffer memory; and wherein the interface controller includes:
   means for receiving a clock signal from the central controller; and
   means responsive to the first operational code word and governed by said clock signal of the central controller to shift a characterization data word of serial format into the shift register of the buffer memory from the central controller.

13. The frequency synthesizer in accordance with claim 11 wherein the buffer memory includes a first shift register which is operative to convert a data word from a parallel format to a serial format; wherein the at least one register of the PLL circuit includes a second shift register which is operative to convert a data word from a serial format to a parallel format; and wherein the interface controller includes means responsive to the second operational code word to transfer the characterization data word, accessed from the buffer memory by the corresponding second data word, to the first shift register in parallel and, governed by an internal clock signal, generated independent of the central controller, to shift the characterization data word serially from the first shift register to the second shift register.

14. The frequency synthesizer in accordance with claim 13 wherein the at least one storage register of the PLL circuit includes a latch register operative, upon command, to transfer in a parallel format the characterization data word of the second shift register to the PLL circuit to characterize the operation thereof in generating the synthesized channel frequency signal; and wherein the interface controller includes means for receiving a select signal from the central controller, and means responsive to the select signal to operate said latch register.

15. The frequency synthesizer in accordance with claim 13 including a second PLL circuit operationally characterized by the central controller to generate another synthesized channel frequency signal, said second PLL circuit including a third shift register operative to convert a data word from a serial format to a parallel format; wherein the interface controller includes means responsive to a third operational code word to transfer a characterization data word in parallel from a register of the buffer memory corresponding to the third operational code word to the first shift register and, governed by the internal clock signal, to shift the characterization data word serially from the first shift register to the third shift register of the second PLL circuit.

16. The frequency synthesizer in accordance with claim 15 wherein the second PLL circuit includes a latch register operative, upon command, to transfer in a parallel format the characterization data word of the third shift register to the second PLL circuit to characterize the operation thereof in generating the other synthesized channel frequency signal; and wherein the interface controller includes means for receiving a select signal from the central controller, and means responsive to the select signal to operate said latch register.

17. The frequency synthesizer in accordance with claim 15 wherein the interface controller includes means responsive to a fourth operational code word and corresponding fourth data word to transfer a first characterization data word in parallel from a register of the buffer memory corresponding to the fourth operational code word to the first shift register and, governed by the internal clock signal, to shift the first characterization data word serially from the first shift register to the second shift register, and upon completion of said shifting operation, to transfer a second characterization data word in parallel from a register of the buffer memory corresponding to the code of the fourth data word to the first shift register and, governed by the internal clock signal, to shift the second characterization data word serially from the first shift register to the second shift register while concurrently shifting the first characterization data word serially from the second shift register to the third shift register, whereby, upon completion of the latter shifting operation, the first characterization data word is stored in the third shift register of the second PLL circuit and the second characterization data word is stored in the second shift register of the PLL circuit.

18. The frequency synthesizer in accordance with claim 17 wherein the PLL circuit includes a first latch circuit operative, upon command, to transfer the characterization data word of the second shift register to the PLL circuit to characterize the operation thereof in generating the synthesized channel frequency signal; wherein the second PLL circuit includes a second latch circuit operative, upon command, to transfer the characterization data word of the third shift register to the second PLL circuit to characterize the operation thereof in generating the other synthesized channel frequency signal; and wherein the interface controller includes means for receiving a select signal from the central controller, and means responsive to the select signal to operate concurrently the first and second latch registers.

19. The frequency synthesizer in accordance with claim 11 wherein the interface controller includes four ports for coupling to the central controller—first port for receiving from the central controller a select signal, second port for receiving from the central controller a clock signal which synchronizes the serial transfer of operational code words and data words, third port for receiving operation code words and data words from the central controller in a serial format, and fourth port for sending data words to the central controller in a serial format.

20. The frequency synthesizer in accordance with claim 19 wherein the interface controller includes means for selectively converting the third port into a bidirectional serial word transfer port for both sending and receiving words of a serial format.

21. The frequency synthesizer in accordance with claim 11 wherein the interface controller includes three ports for coupling to the central controller—first port for receiving a select signal, second port for receiving a clock signal which synchronizes the serial transfer of operational code words and data words, and third port for bidirectionally sending and receiving words of a serial format respectively to and from the central controller.

22. A frequency synthesizer including a plurality of phase lock loop (PLL) circuits, each operationally characterized by a central controller to generate a corresponding synthesized channel frequency signal, each including a storage register dynamically programmable with data words which characterize the operation of its corresponding PLL circuit in generating its synthesized channel frequency signal, said frequency synthesizer comprising:

an interface controller operative to receive operational code words, corresponding data words, and characterization data words from the central controller; and a buffer memory coupled to said interface controller for storing a plurality of characterization data words in a corresponding plurality of registers, each such data word corresponding to a unique characterization of operation of a PLL circuit in generating its synthesized channel frequency signal, said interface controller responsive to an operational code word and corresponding data word to direct a transfer of a characterization data word from a selected register of said buffer memory to the storage register of a selected one of said plurality of PLL circuits.

23. The frequency synthesizer in accordance with claim 22 wherein the interface controller directs the transfer of a characterization data word from the buffer memory to a selected one of said plurality of PLL circuits autonomously in response to an operational code word and corresponding data word received from the central controller.

24. The frequency synthesizer in accordance with claim 22 wherein the interface controller includes means for accessing a characterization data word from a register of the buffer memory based on the code of a corresponding data word for transfer to a PLL circuit.

25. The frequency synthesizer in accordance with claim 22 wherein the interface controller includes means for accessing a characterization data word from a register of the buffer memory based on the code of an operational code word for transfer to a PLL circuit.

26. The frequency synthesizer in accordance with claim 22 wherein the interface controller includes means responsive to a single operational code word and single corresponding data word to direct a transfer of a plurality of characterization data words from selected corresponding registers of the buffer memory to the storage registers of a selected corresponding plurality of PLL circuits.

* * * * *